US007147759B2

(12) United States Patent
Chistyakov

(10) Patent No.: US 7,147,759 B2
(45) Date of Patent: *Dec. 12, 2006

(54) HIGH-POWER PULSED MAGNETRON SPUTTERING

(75) Inventor: Roman Chistyakov, Andover, MA (US)

(73) Assignee: Zond, Inc., Mansfield, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/065,277

(22) Filed: Sep. 30, 2002

(65) Prior Publication Data

US 2004/0060813 A1    Apr. 1, 2004

(51) Int. Cl.
C23C 14/35 (2006.01)

(52) U.S. Cl. .................... 204/192.12; 204/192.13; 204/298.03; 204/298.06; 204/298.08; 204/298.14; 204/298.19

(58) Field of Classification Search ........... 204/192.12, 204/192.13, 298.03, 298.06, 298.08, 298.14, 204/298.19, 298.26
See application file for complete search history.

(56) References Cited

U.S. PATENT DOCUMENTS

| | | |
|---|---|---|
| 3,516,920 A | 6/1970 | Muly, Jr. et al. |
| 4,953,174 A | 8/1990 | Eldridge et al. ............... 372/87 |
| 4,965,248 A | 10/1990 | Poppe et al. .................... 505/1 |
| 5,015,493 A | 5/1991 | Gruen ......................... 427/38 |
| 5,616,224 A | 4/1997 | Boling |
| 5,875,207 A | 2/1999 | Osmanow .................... 372/86 |
| 5,942,089 A | 8/1999 | Sproul et al. |
| 6,083,361 A | 7/2000 | Kobayashi et al. |
| 6,296,742 B1 | 10/2001 | Kouznetsov ........... 204/192.12 |
| 6,342,132 B1 | 1/2002 | Rossnagel |
| 6,398,929 B1 * | 6/2002 | Chiang et al. ......... 204/298.11 |
| 6,413,382 B1 | 7/2002 | Wang et al. ........... 204/192.12 |
| 6,436,251 B1 | 8/2002 | Gopalraja et al. ..... 204/298.12 |
| 6,440,280 B1 | 8/2002 | Burton et al. |
| 6,456,642 B1 | 9/2002 | Hilliard |
| 2002/0033480 A1 | 3/2002 | Kawamata et al. |
| 2005/0252763 A1 * | 11/2005 | Chistyakov ............ 204/192.12 |

FOREIGN PATENT DOCUMENTS

DE    3210351 A1    9/1983

(Continued)

OTHER PUBLICATIONS

Booth, et al., The Transition From Symmetric To Asymmetric Discharges In Pulsed 13.56 MHz Capacity Coupled Plasmas, J. Appl. Phys., Jul. 15, 1997, pp. 552-560, vol. 82 (2), American Institute of Physics.

(Continued)

Primary Examiner—Rodney G. McDonald
(74) Attorney, Agent, or Firm—Kurt Rauschenbach; Rauschenbach Patent Law Group, LLC

(57) ABSTRACT

Magnetically enhanced sputtering methods and apparatus are described. A magnetically enhanced sputtering source according to the present invention includes an anode and a cathode assembly having a target that is positioned adjacent to the anode. An ionization source generates a weakly-ionized plasma proximate to the anode and the cathode assembly. A magnet is positioned to generate a magnetic field proximate to the weakly-ionized plasma. The magnetic field substantially traps electrons in the weakly-ionized plasma proximate to the sputtering target. A power supply produces an electric field in a gap between the anode and the cathode assembly. The electric field generates excited atoms in the weakly ionized plasma and generates secondary electrons from the sputtering target. The secondary electrons ionize the excited atoms, thereby creating a strongly-ionized plasma having ions that impact a surface of the sputtering target to generate sputtering flux.

50 Claims, 18 Drawing Sheets

FOREIGN PATENT DOCUMENTS

| EP | 0 788 139 A1 | 8/1997 |
| GB | 1339910 | 12/1973 |
| JP | 57194254 | 11/1982 |
| JP | 10204633 | 8/1998 |
| WO | WO9504368 * | 2/1995 |
| WO | WO 98/40532 | 9/1998 |
| WO | WO 01/98553 A1 | 12/2001 |

OTHER PUBLICATIONS

Bunshah, et al., Deposition Technologies For Films And Coatings, Materials Science Series, pp. 176-183, Noyes Publications, Park Ridge, New Jersey.

Daugherty, et al., Attachment-Dominated Electron-Beam-Ionized Discharges, Applied Science Letters, May 15, 1976, vol. 28, No. 10, American Institute of Physics.

Goto, et al., Dual Excitation Reactive Ion Etcher for Low Energy Plasma Processing, J. Vac. Sci. Technol. A, Sep./Oct. 1992, pp. 3048-3054, vol. 10, No. 5, American Vacuum Society.

Kouznetsov, et al., A Novel Pulsed Magnetron Sputter Technique Utilizing Very High Target Power Densities, Surface & Coatings Technology, pp. 290-293, Elsevier Sciences S.A.

Lindquist, et al., High Selectivity Plasma Etching Of Silicon Dioxide With A Dual Frequency 27/2 MHz Capacitive RF Discharge.

Macak, Reactive Sputter Deposition Process of Al2O3 and Characterization Of A Novel High Plasma Density Pulsed Magnetron Discharge, Linkoping Studies in Science And Technology, 1999, pp. 1-2, Sweden.

Macak, et al., Ionized Sputter Deposition Using An Extremely High Plasma Density Pulsed Magnetron Discharge, J. Vac. Sci. Technol. A., Jul./Aug. 2000, pp. 1533-1537, vol. 18, No. 4, American Vacuum Society.

Mozgrin, et al., High-Current Low-Pressure Quasi-Stationary Discharge In A Magnetic Field: Experimental Research, Plasma Physics Reports, 1995, pp. 400-409, vol. 21, No. 5, Mozgrin, Feitsov, Khodachenko.

Rossnagel, et al., Induced Drift Currents In Circular Planar Magnetrons, J. Vac. Sci. Technol. A., Jan./Feb. 1987, pp. 88-91, vol. 5, No. 1, American Vacuum Society.

Sheridan, et al., Electron Velocity Distribution Functions In A Sputtering Magnetron Discharge For The EXB Direction, J. Vac. Sci. Technol. A., Jul./Aug. 1998, pp. 2173-2176, vol. 16, No. 4, American Vacuum Society.

Steinbruchel, A Simple Formula For Low-Energy Sputtering Yields, Applied Physics A., 1985, pp. 37-42, vol. 36, Springer-Verlag.

Turenko, et al., Magnetron Discharge In The Vapor Of The Cathode Material, Soviet Technical Physics Letters, Jul. 1989, pp. 519-520; vol. 15, No. 7, New York, US.

Encyclopedia Of Low Temperature Plasma, p. 119, vol. 3.

Encyclopedia Of Low Temperature Plasma, p. 123, vol. 3.

Sugimoto, et al; Magnetic Condensation Of A Photoexcited Plasma During Fluoropolymer Sputtering; J. Appl. Phys.; Feb. 15, 1990; pp. 2093-2099; vol. 67, No. 4; American Institute of Physics; New York, US.

Yamaya, et al; Use Of A Helicon-Wave Excited Plasma For Aluminum-Doped ZnO Thin-Film Sputtering; Appl. Phys. Lett.; Jan. 12, 1998; pp. 235-237; vol. 72; No. 2; American Institute of Physics: New York US.

* cited by examiner

HIGH-POWER PULSED MAGNETRON SPUTTERING

BACKGROUND OF INVENTION

Sputtering is a well-known technique for depositing films on substrates. Sputtering is the physical ejection of atoms from a target surface and is sometimes referred to as physical vapor deposition (PVD). Ions, such as argon ions, are generated and then directed to a target surface where the ions physically sputter target material atoms. The target material atoms ballistically flow to a substrate where they deposit as a film of target material.

Diode sputtering systems include a target and an anode. Sputtering is achieved in a diode sputtering system by establishing an electrical discharge in a gas between two parallel-plate electrodes inside a chamber. A potential of several kilovolts is typically applied between planar electrodes in an inert gas atmosphere (e.g., argon) at pressures that are between about $10^{-1}$ and $10^{-2}$ Torr. A plasma discharge is then formed. The plasma discharge is separated from each electrode by what is referred to as the dark space.

The plasma discharge has a relatively constant positive potential with respect to the target. Ions are drawn out of the plasma, and are accelerated across the cathode dark space. The target has a lower potential than the region in which the plasma is formed. Therefore, the target attracts positive ions. Positive ions move towards the target with a high velocity. Positive ions impact the target and cause atoms to physically dislodge or sputter from the target. The sputtered atoms then propagate to a substrate where they deposit a film of sputtered target material. The plasma is replenished by electron-ion pairs formed by the collision of neutral molecules with secondary electrons generated at the target surface.

Magnetron sputtering systems use magnetic fields that are shaped to trap and to concentrate secondary electrons, which are produced by ion bombardment of the target surface. The plasma discharge generated by a magnetron sputtering system is located proximate to the surface of the target and has a high density of electrons. The high density of electrons causes ionization of the sputtering gas in a region that is close to the target surface.

One type of magnetron sputtering system is a planar magnetron sputtering system. Planar magnetron sputtering systems are similar in configuration to diode sputtering systems. However, the magnets (permanent or electromagnets) in planar magnetron sputtering systems are placed behind the cathode. The magnetic field lines generated by the magnets enter and leave the target cathode substantially normal to the cathode surface. Electrons are trapped in the electric and magnetic fields. The trapped electrons enhance the efficiency of the discharge and reduce the energy dissipated by electrons arriving at the substrate.

Conventional magnetron sputtering systems deposit films that have relatively low uniformity. However, the film uniformity can be increased by mechanically moving the substrate and/or the magnetron, but such systems are relatively complex and expensive to implement. Conventional magnetron sputtering systems also have relatively poor target utilization. By poor target utilization, we mean that the target material erodes in a non-uniform manner.

BRIEF DESCRIPTION OF DRAWINGS

This invention is described with particularity in the detailed description. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

The magnetic and electric fields in magnetron sputtering systems are concentrated in narrow regions close to the surface of the target. These narrow regions are located between the poles of the magnets used for producing the magnetic field. Most of the ionization of the sputtering gas occurs in these localized regions. The location of the ionization regions causes a non-uniform erosion or wear of the target that results in poor target utilization.

Increasing the power applied between the target and the anode can increase the amount of ionized gas and, therefore, increase the target utilization. However, undesirable target heating and target damage can occur. Furthermore, increasing the voltage applied between the target and the anode increases the probability of establishing an undesirable electrical discharge (an electrical arc) in the process chamber.

Pulsing the power applied to the plasma can be advantageous since the average discharge power can remain low while relatively large power pulses can be periodically applied. Additionally, the duration of these large voltage pulses can be preset so as to reduce the probability of establishing an electrical breakdown condition leading to an undesirable electrical discharge. However, very large power pulses can still result in undesirable electrical discharges and undesirable target heating regardless of their duration.

Figure 1:
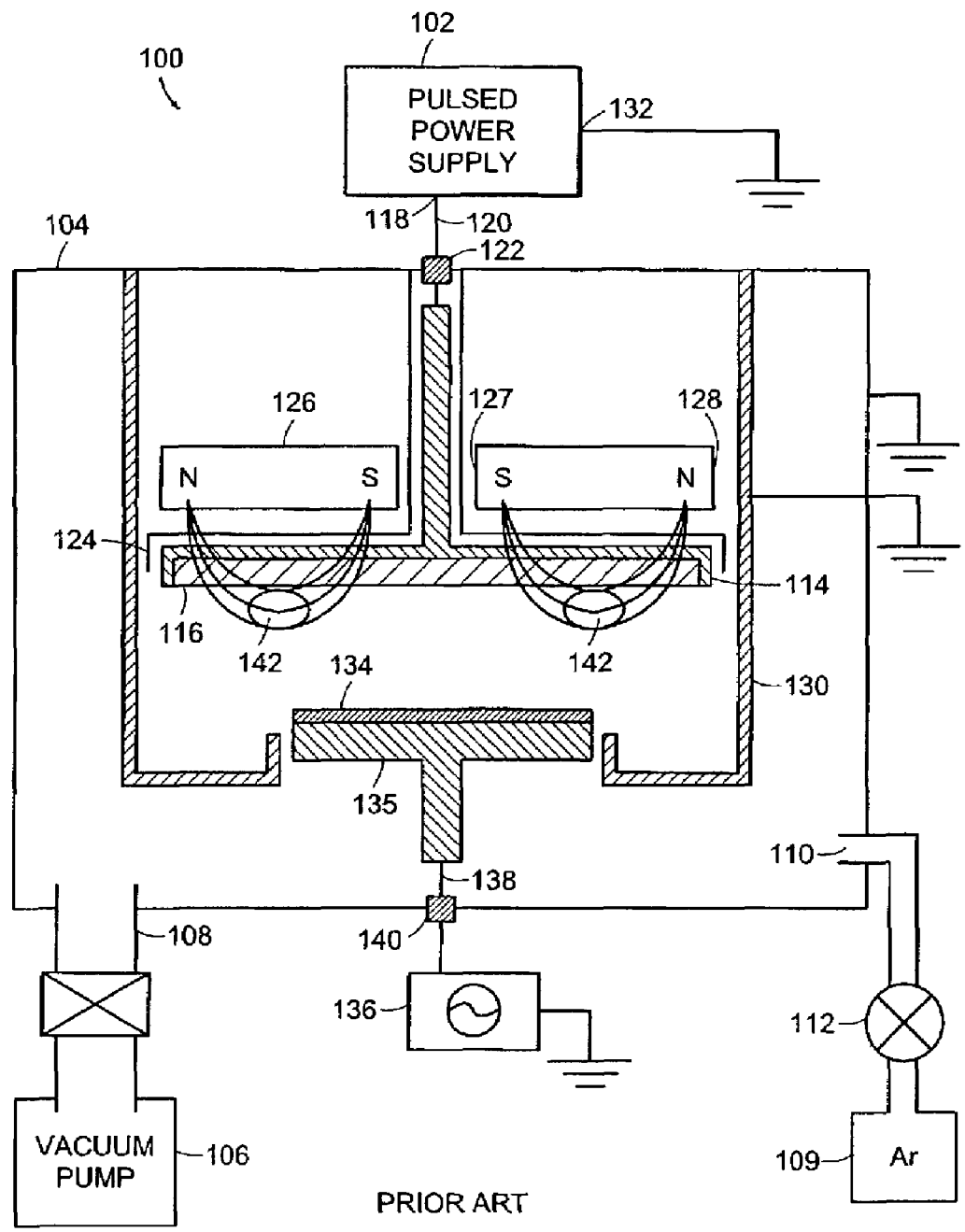
FIG. 1 illustrates a cross-sectional view of a known magnetron sputtering apparatus having a pulsed power source.

FIG. 1 illustrates a cross-sectional view of a known magnetron sputtering apparatus 100 having a pulsed power source 102. The known magnetron sputtering apparatus 100 includes a vacuum chamber 104 where the sputtering process is performed. The vacuum chamber 104 is positioned in fluid communication with a vacuum pump 106 via a conduit 108. The vacuum pump 106 is adapted to evacuate the vacuum chamber 104 to high vacuum. The pressure inside the vacuum chamber 104 is generally less than 100 Pa during operation. A feed gas source 109, such as an argon gas source, is introduced into the vacuum chamber 104 through a gas inlet 110. The gas flow is controlled by a valve 112.

The magnetron sputtering apparatus 100 also includes a cathode assembly 114 having a target material 116. The cathode assembly 114 is generally in the shape of a circular disk. The cathode assembly 114 is electrically connected to a first output 118 of the pulsed power supply 102 with an electrical transmission line 120. The cathode assembly 114 is typically coupled to the negative potential of the pulsed power supply 102. In order to isolate the cathode assembly 114 from the vacuum chamber 104, an insulator 122 can be used to pass the electrical transmission line 120 through a wall of the vacuum chamber 104. A grounded shield 124 can be positioned behind the cathode assembly 114 to protect a magnet 126 from bombarding ions. The magnet 126 shown in FIG. 1 is generally ring-shaped having its south pole 127 on the inside of the ring and its north pole 128 on the outside of the ring. Many other magnet configurations can also be used.

An anode 130 is positioned in the vacuum chamber 104 proximate to the cathode assembly 114. The anode 130 is typically coupled to ground. A second output 132 of the pulsed power supply 102 is also typically coupled to ground. A substrate 134 is positioned in the vacuum chamber 104 on a substrate support 135 to receive the sputtered target material 116. The substrate 134 can be electrically connected to a bias voltage power supply 136 with a transmission line 138. In order to isolate the bias voltage power supply 136 from the vacuum chamber 104, an insulator 140 can be used to pass the electrical transmission line 138 through a wall of the vacuum chamber 104.

In operation, the pulsed power supply 102 applies a voltage pulse between the cathode assembly 114 and the anode 130 that has a sufficient amplitude to ionize the argon feed gas in the vacuum chamber 104. This typical ionization process is referred to as direct ionization or atomic ionization by electron impact and can be described as follows:

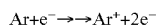

$$Ar + e^- \rightarrow Ar^+ + 2e^-$$

where Ar represents a neutral argon atom in the feed gas and $e^-$ represents an ionizing electron generated in response to the voltage pulse applied between the cathode assembly 114 and the anode 130. The collision between the neutral argon atom and the ionizing electron results in an argon ion ($Ar^+$) and two electrons.

The negatively biased cathode assembly 114 attracts positively charged ions with sufficient acceleration so that the ions sputter the target material 116. A portion of the sputtered target material 116 is deposited on the substrate 134.

The electrons, which cause the ionization, are generally confined by the magnetic fields produced by the magnet 126. The magnetic confinement is strongest in a confinement region 142 where there is relatively low magnetic field intensity. The confinement region 142 is substantially in the shape of a ring that is located proximate to the target material. Generally, a higher concentration of positively charged ions in the plasma is present in the confinement region 142 than elsewhere in the chamber 104. Consequently, the target material 116 is eroded rapidly in areas directly adjacent to the higher concentration of positively charged ions. The rapid erosion in these areas results in undesirable non-uniform erosion of the target material 116 and, thus relatively poor target utilization.

Dramatically increasing the power applied to the plasma can result in more uniform erosion of the target material 116. However, the amount of applied power necessary to achieve this increased uniformity can increase the probability of generating an electrical breakdown condition that leads to an undesirable electrical discharge between the cathode assembly 114 and the anode 130 regardless of the duration of the pulses. An undesirable electrical discharge will corrupt the sputtering process and cause contamination in the vacuum chamber 104. Additionally, the increased power can overheat the target and cause target damage.

Figure 2:
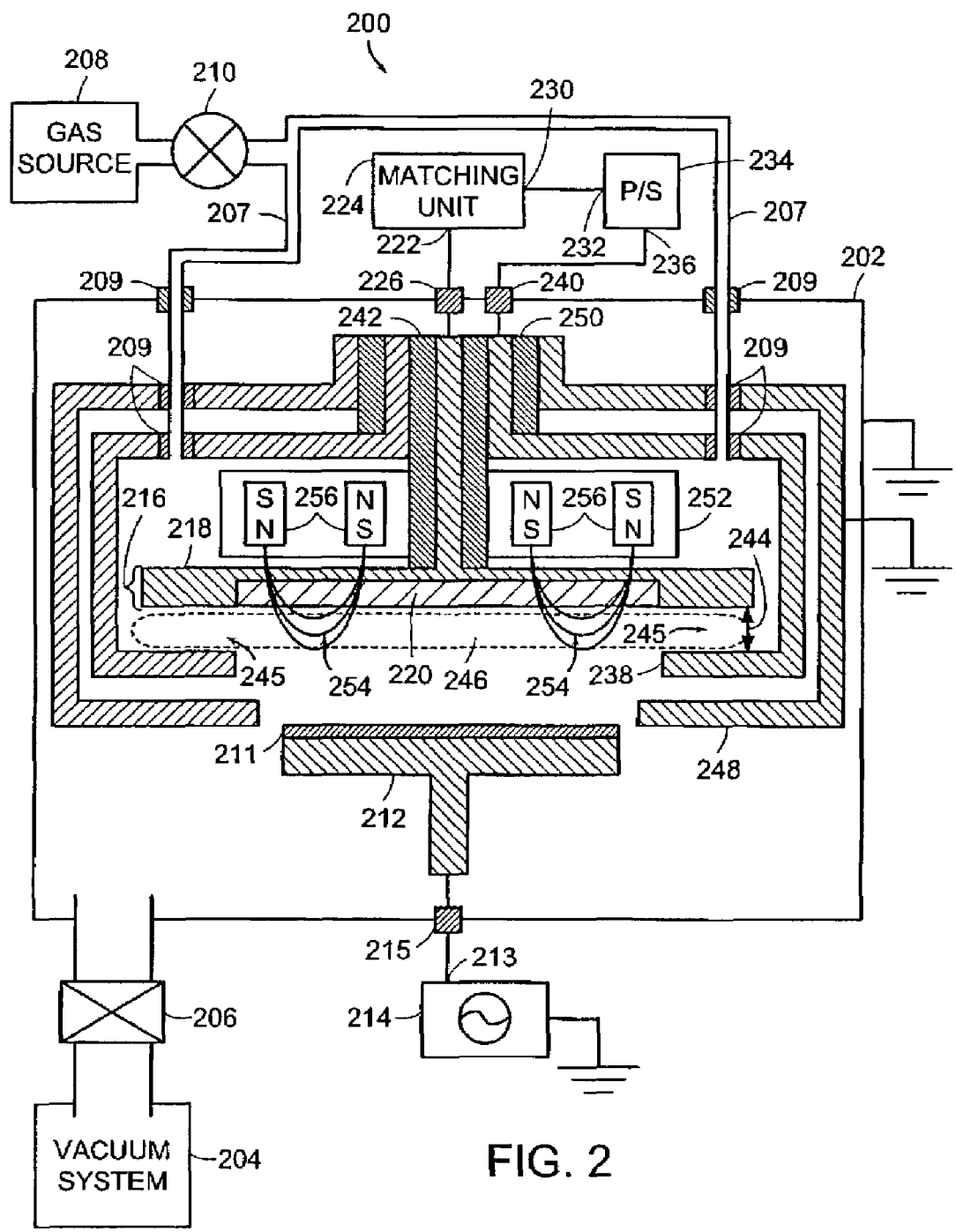
FIG. 2 illustrates a cross-sectional view of an embodiment of a magnetron sputtering apparatus according to the present invention.

FIG. 2 illustrates a cross-sectional view of an embodiment of a magnetron sputtering apparatus 200 according to the present invention. The magnetron sputtering apparatus 200 includes a chamber 202, such as a vacuum chamber. The chamber 202 is coupled in fluid communication to a vacuum system 204 through a vacuum control system 206. In one embodiment, the chamber 202 is electrically coupled to ground potential. The chamber 202 is coupled by one or more gas lines 207 to a feed gas source 208. In one embodiment, the gas lines 207 are isolated from the chamber and other components by insulators 209. Additionally, the gas lines 207 can be isolated from the feed gas source using in-line insulating couplers (not shown). A gas flow control system 210 controls the gas flow to the chamber 202. The gas source 208 can contain any feed gas, such as argon. In some embodiments, the feed gas includes a mixture of gases. In some embodiments, the feed gas includes a reactive gas.

A substrate 211 to be sputter coated is supported in the chamber 202 by a substrate support 212. The substrate 211 can be any type of work piece such as a semiconductor wafer. In one embodiment, the substrate support 212 is electrically coupled to an output 213 of a bias voltage source 214. An insulator 215 isolates the bias voltage source 214 from a wall of the chamber 202. In one embodiment, the bias voltage source 214 is an alternating current (AC) power source, such as a radio frequency (RF) power source. In other embodiments (not shown), the substrate support 212 is coupled to ground potential or is electrically floating.

The magnetron sputtering apparatus 200 also includes a cathode assembly 216. In one embodiment, the cathode assembly 216 includes a cathode 218 and a sputtering target 220 composed of target material. The sputtering target 220 is in contact with the cathode 218. In one embodiment, the sputtering target 220 is positioned inside the cathode 218. The distance from the sputtering target 220 to the substrate 211 can vary from a few centimeters to about one hundred centimeters.

The target material can be any material suitable for sputtering. For example, the target material can be a metallic material, polymer material, superconductive material, magnetic material including ferromagnetic material, non-magnetic material, conductive material, non-conductive material, composite material, reactive material, or a refractory material.

The cathode assembly 216 is coupled to an output 222 of a matching unit 224. An insulator 226 isolates the cathode assembly 216 from a grounded wall of the chamber 202. An input 230 of the matching unit 224 is coupled to a first output 232 of a pulsed power supply 234. A second output 236 of the pulsed power supply 234 is coupled to an anode 238. An insulator 240 isolates the anode 238 from a grounded wall of the chamber 202. Another insulator 242 isolates the anode 238 from the cathode assembly 216.

In one embodiment, the first output 232 of the pulsed power supply 234 is directly coupled to the cathode assembly 216 (not shown). In one embodiment, the second output 236 of the pulsed power supply 234 is coupled to ground (not shown). In this embodiment, the anode 238 is also coupled to ground (not shown).

In one embodiment (not shown), the first output 232 of the pulsed power supply 234 couples a negative voltage impulse to the cathode assembly 216. In another embodiment (not shown), the first output 232 of the pulsed power supply 234 couples a positive voltage impulse to the anode 238.

In one embodiment, the pulsed power supply 234 generates peak voltage levels of up to about 30,000V. Typical operating voltages are generally between about 100V and 30 kV. In one embodiment, the pulsed power supply 234 generates peak current levels of less than one ampere to about 5,000 A or more depending on the size of the magnetron sputtering system. Typical operating currents varying from less than a few amperes to more than a few thousand amperes depending on the size of the magnetron sputtering system. In one embodiment, the power pulses have a repetition rate that is below 1 kHz. In one embodiment, the pulse width of the pulses generated by the pulsed power supply 234 is substantially between about one microsecond and several seconds.

The anode 238 is positioned so as to form a gap 244 between the anode 238 and the cathode assembly 216 that is sufficient to allow current to flow through a region 245 between the anode 238 and the cathode assembly 216. In one embodiment, the gap 244 is between approximately 0.3 centimeters (0.3 cm) and ten centimeters (10 cm). The volume of region 245 is determined by the area of the sputtering target 220. The gap 244 and the total volume of region 245 are parameters in the ionization process as will be discussed with reference to FIG. 3.

An anode shield 248 is positioned adjacent to the anode 238 so as to protect the interior wall of the chamber 202 from being exposed to sputtered target material. Additionally, the anode shield 248 can function as an electric shield to electrically isolate the anode 238 from the plasma. In one embodiment, the anode shield 248 is coupled to ground potential. An insulator 250 is positioned to isolate the anode shield 248 from the anode 238.

The magnetron sputtering apparatus 200 also includes a magnet assembly 252. In one embodiment, the magnet assembly 252 is adapted to create a magnetic field 254 proximate to the cathode assembly 216. The magnet assembly 252 can include permanent magnets 256, or alternatively, electro-magnets (not shown). The configuration of the magnet assembly 252 can be varied depending on the desired shape and strength of the magnetic field 254. In alternate embodiments, the magnet assembly can have either a balanced or unbalanced configuration.

In one embodiment, the magnet assembly 252 includes switching electro-magnets, which generate a pulsed magnetic field proximate to the cathode assembly 216. In some embodiments, additional magnet assemblies (not shown) can be placed at various locations throughout the chamber 202 to direct different types of sputtered target materials to the substrate 212.

In one embodiment, the magnetron sputtering apparatus 200 is operated by generating the magnetic field 254 proximate to the cathode assembly 216. In the embodiment shown in FIG. 2, the permanent magnets 256 continuously generate the magnetic field 254. In other embodiments, the magnetic field 254 is generated by energizing a current source (not shown) that is coupled to electro-magnets. In one embodiment, the strength of the magnetic field 254 is between about one hundred and two thousand gauss. After the magnetic field 254 is generated, the feed gas from the gas source 208 is supplied to the chamber 202 by the gas flow control system 210. In one embodiment, the feed gas is supplied to the chamber 202 directly between the cathode assembly 216 and the anode 238.

In one embodiment, the pulsed power supply 234 is a component in an ionization source that generates the weakly-ionized plasma. The pulsed power supply applies a voltage pulse between the cathode assembly 216 and the anode 238. In one embodiment, the pulsed power supply 234 applies a negative voltage pulse to the cathode assembly 216. The amplitude and shape of the voltage pulse are such that a weakly-ionized plasma is generated in the region 246 between the anode 238 and the cathode assembly 216. The weakly-ionized plasma is also referred to as a pre-ionized plasma. In one embodiment, the peak plasma density of the pre-ionized plasma is between about $10^6$ and $10^{12}$ cm$^{-3}$ for argon feed gas. The pressure in the chamber can vary from about $10^{-3}$ to 10 Torr. The peak plasma density of the pre-ionized plasma depends on the properties of the specific magnetron sputtering system and is a function of the location of the measurement in the pre-ionized plasma.

In one embodiment, the pulsed power supply 234 generates a low power pulse having an initial voltage of between about one hundred volts and five kilovolts with a discharge current of between about 0.1 amperes and one hundred amperes in order to generate the weakly-ionized plasma. In some embodiments the width of the pulse can be in on the order of 0.1 microseconds up to one hundred seconds. Specific parameters of the pulse are discussed herein in more detail in connection with FIG. 4 and FIG. 5.

In one embodiment, prior to the generating of the weakly-ionized plasma, the pulsed power supply 234 generates a potential difference between the cathode assembly 216 and the anode 238 before the feed gas is supplied between the cathode assembly 216 and the anode 238.

In another embodiment, a direct current (DC) power supply (not shown) is used to generate and maintain the weakly-ionized or pre-ionized plasma. In this embodiment, the DC power supply is adapted to generate a voltage that is large enough to ignite the pre-ionized plasma. In one embodiment, the DC power supply generates an initial voltage of several kilovolts with a discharge current of several hundred milliamps between the cathode assembly 216 and the anode 238 in order to generate and maintain the pre-ionized plasma. The value of the current depends on the power level generated by the power supply and is a function of the size of the magnetron. Additionally, the presence of a magnetic field in the region 245 can have a dramatic effect on the value of the applied voltage and current required to generate the weakly-ionized plasma.

In some embodiments, the DC power supply generates a current that is between about 1 mA and 100 A depending on the size of the magnetron and the strength of a magnetic field in the region 245. In one embodiment, before generating the weakly-ionized plasma, the DC power supply is adapted to generate and maintain an initial voltage between the cathode assembly 216 and the anode 238 before the introduction of the feed gas.

The pre-ionized or weakly-ionized plasma can be generated by numerous other techniques including UV radiation techniques, X-ray techniques, electron beam techniques, ion beam techniques, or ionizing filament techniques, for example. In one embodiment, an alternating current (AC) power supply can be used. Generally, an AC power supply can require less power to generate a weakly-ionized plasma than a DC power supply.

Forming a weakly-ionized or pre-ionized plasma substantially eliminates the probability of establishing a breakdown condition in the chamber 202 when high-power pulses are applied between the cathode assembly 216 and the anode 238. The probability of establishing a breakdown condition is substantially eliminated because the weakly-ionized plasma has a low-level of ionization that provides electrical conductivity through the plasma. This conductivity substantially prevents the formation of a breakdown condition, even when high power is applied to the plasma.

Once the weakly-ionized plasma is formed, high-power pulses are then generated between the cathode assembly 216 and the anode 238. In one embodiment, the pulsed power supply 234 generates the high-power pulses. The desired power level of the high-power pulse depends on several factors including the desired deposition rate, the density of the pre-ionized plasma, and the size of the magnetron, for example. In one embodiment, the power level of the high-power pulse is in the range of about one kilowatt to about ten megawatts or more. This power level range corresponds to target densities that are on the order of 0.01 kilowatt per square centimeter to more than ten kilowatts per square centimeter.

Each of the high-power pulses are maintained for a predetermined time that, in alternate embodiments, is approximately one microsecond to ten seconds. The repetition frequency or repetition rate of the high-power pulses, in one embodiment, is in the range of between about 0.1 Hz to 1 kHz. In order to minimize undesirable target heating, the average power generated by the pulsed power supply 234 can be less than one megawatt depending on the size of the magnetron. In one embodiment, the thermal energy in the sputtering target 220 is conducted away or dissipated by liquid or gas cooling such as helium cooling (not shown).

The high-power pulses generate a strong electric field between the cathode assembly 216 and the anode 238. This strong electric field is substantially located in the region 245 that is in the gap 244 between the cathode assembly 216 and the anode 238. In one embodiment, the electric field is a pulsed electric field. In another embodiment, the electric field is a quasi-static electric field. By quasi-static electric field, we mean an electric field that has a characteristic time of electric field variation that is much greater than the collision time for electrons with neutral gas particles. Such a time of electric field variation can be on the order of ten seconds. The strength and the position of the strong electric field will be discussed in more detail with reference to FIG. 3.

The high-power pulses generate a highly-ionized or a strongly-ionized plasma from the weakly-ionized plasma. The discharge current density that is formed from this strongly-ionized plasma can be as high as about five-hundred amperes per squared centimeter or more for a pressure that is as high as about ten Torr. Since the sputtering target 220 is typically negatively biased, the positively charged ions in the strongly-ionized plasma accelerate at high velocity towards the sputtering target 220. The accelerated ions impact the surface of the sputtering target 220, causing the target material to be sputtered. The strongly-ionized plasma of the present invention results in a very high sputtering rate of the target material.

In addition, the strongly-ionized plasma tends to diffuse homogenously in the region 246. The homogenous diffusion results in accelerated ions impacting the surface of the sputtering target 220 in a more uniform manner than with conventional magnetron sputtering. Consequently, the surface of the sputtering target 220 is eroded more evenly and, thus higher target utilization is achieved. Furthermore, since the target material is sputtered more uniformly across the surface of the sputtering target 220, the uniformity and homogeneity of the material deposited on the substrate 211 is also increased without the necessity of rotating the substrate 211 and/or the magnet assembly 252. The physical mechanism responsible for this homogenous diffusion is described with reference to FIG. 6A through FIG. 6D.

In one embodiment, the high-power pulsed magnetron sputtering system 200 of the present invention generates a relatively high electron temperature plasma and a relatively high density plasma. One application for the high-power pulsed magnetron sputtering system 200 of the present invention is ionized physical vapor deposition (IPVD), which is a technique that converts neutral sputtered atoms into positive ions to enhance the sputtering process.

Figure 3:
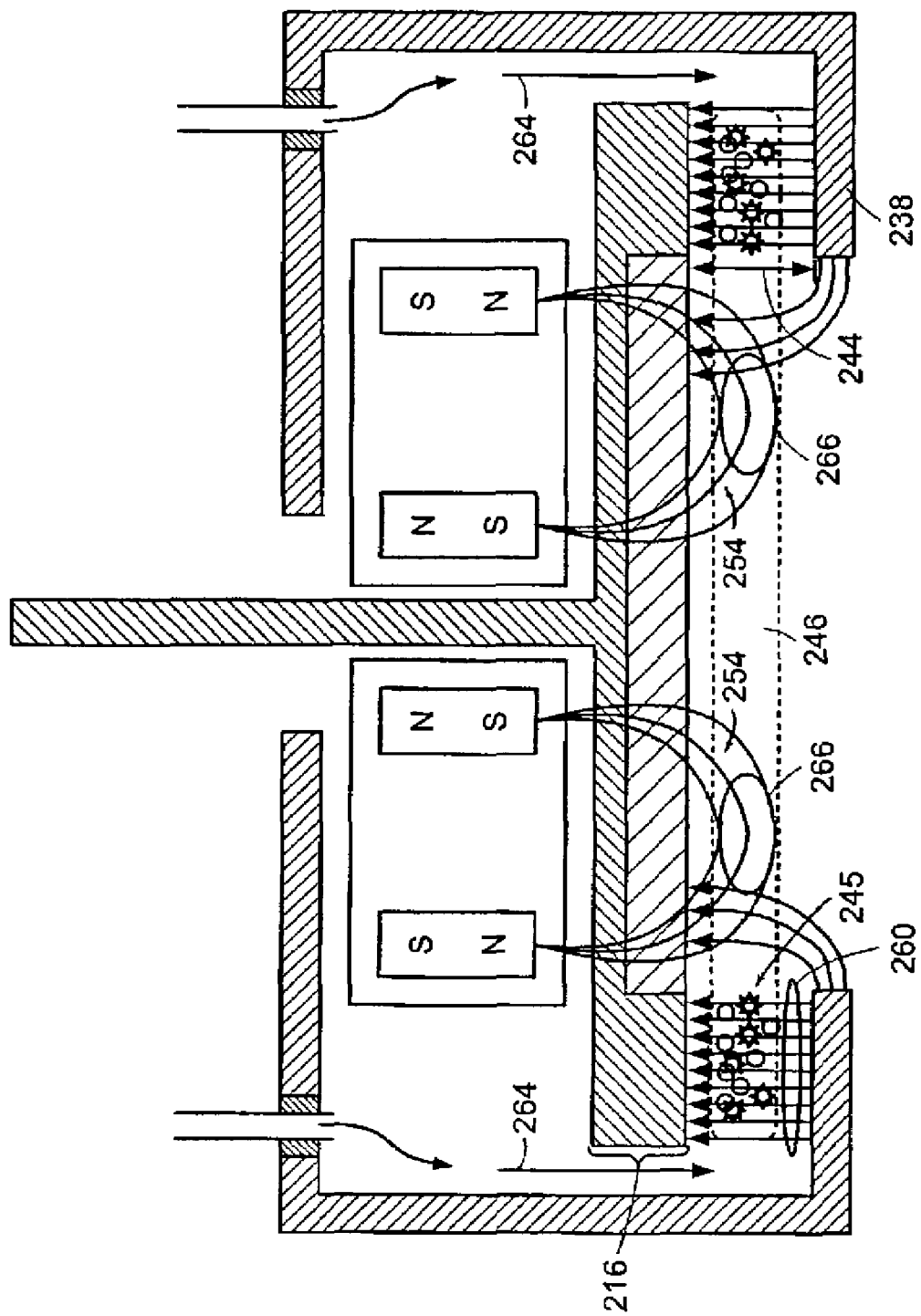
FIG. 3 illustrates a cross-sectional view of the anode and the cathode assembly of the magnetron sputtering apparatus of FIG. 2.

FIG. 3 illustrates a cross-sectional view of the cathode assembly 216 and the anode 238 of FIG. 2. In one embodiment, the strong electric field 260 is located in the region 245 between the cathode assembly 216 and the anode 238. The strong electric field 260 facilitates a multi-step ionization process that substantially increases the rate at which the strongly-ionized plasma is formed.

The feed gas 264 flows between the cathode assembly 216 and the anode 238. A pre-ionizing voltage is applied between the cathode assembly 216 and the anode 238 across the feed gas 264 which forms the weakly-ionized plasma. The weakly-ionized plasma is generally formed in the region 245 and diffuses to a region 266 as the feed gas 264 continues to flow. The electrons in the weakly-ionized plasma are substantially trapped in the region 266 by the magnetic field 254. In one embodiment (not shown), the magnetic field 254 is generated in the region 245 to substantially trap electrons where the weakly-ionized plasma is ignited.

After the formation of the weakly-ionized plasma, a high-power pulse is then applied between the cathode assembly 216 and the anode 238. This high-power pulse generates the strong electric field 260 in the region 245 between the cathode assembly 216 and the anode 238. The strong electric field 260 results in collisions occurring between neutral atoms and ions in the weakly ionized plasma. These collisions generate numerous excited atoms in the weakly-ionized plasma. The accumulation of excited atoms in the weakly-ionized plasma alters the ionization process. Instead of direct ionization, the strongly-ionized plasma is generated by a multi-step ionization process having an efficiency that increases as the density of excited atoms in the weakly-ionized plasma increases.

The distance or gap 244 between the cathode assembly 216 and the anode 238 is chosen so as to maximize the rate of excitation of the atoms. The value of the electric field 260 in the region 245 depends on the voltage level applied by the pulsed power supply 234 (FIG. 2) and the size of the gap 244 between the anode 238 and the cathode assembly 216. In alternative embodiments, the strength of the electric field 260 can vary between about 10V/cm and $10^5$V/cm depending on various parameters and operating conditions of the magnetron system. In some embodiments, the gap 244 can be between about 0.30 cm and about 10 cm depending on various parameters of the process. In one embodiment, the electric field 260 in the region 245 is rapidly applied to the pre-ionized or weakly-ionized plasma. In some embodiments, the rapidly applied electric field 260 is generated by a voltage pulse having a rise time that is between about 0.1 microsecond and ten seconds.

In one embodiment, the dimensions of the gap 244 and the parameters of the applied electric field 260 are varied in order to determine the optimum condition for a relatively high rate of excitation of the atoms in the region 245. For example, an argon atom requires an energy of about 11.55 eV to become excited. Thus, as the feed gas 264 flows through the region 245, the weakly-ionized plasma is formed and the atoms in the weakly-ionized plasma undergo a stepwise ionization process. The excited atoms in the weakly-ionized plasma then encounter the electrons that are trapped in the region 266 by the magnetic field 254. Since excited atoms only require about 4 eV of energy to ionize while neutral atoms require about 15.76 eV of energy to ionize, the excited atoms will ionize at a much higher rate than neutral atoms. In one embodiment, ions in the strongly-ionized plasma bombard the sputtering target 220 causing secondary electron emission from the sputtering target 220. These secondary electrons are substantially trapped by the magnetic field 254 and interact with any neutral or excited atoms in the strongly-ionized plasma. This process further increases the density of ions in the strongly-ionized plasma as the feed gas 264 is replenished.

The multi-step ionization process corresponding to the rapid application of the electric field 260 can be described as follows:

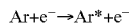

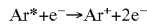

where Ar represents a neutral argon atom in the feed gas and e⁻ represents an ionizing electron generated in response to a pre-ionized plasma, when sufficient voltage is applied between the cathode assembly 216 and the anode 238. Additionally, Ar* represents an excited argon atom in the weakly-ionized plasma. The collision between the excited argon atom and the ionizing electron results in an argon ion (Ar⁺) and two electrons.

As previously discussed, the excited argon atoms generally require less energy to become ionized than neutral argon atoms. Thus, the excited atoms tend to more rapidly ionize near the surface of the sputtering target 220 than the neutral argon atoms. As the density of the excited atoms in the plasma increases, the efficiency of the ionization process rapidly increases. The increased efficiency eventually results in an avalanche-like increase in the density of the strongly-ionized plasma. Under appropriate excitation conditions, the proportion of the energy applied to the weakly-ionized plasma which is transformed to the excited atoms is very high for a pulsed discharge in the feed gas.

Thus, in one embodiment of the invention, high power pulses are applied to a weakly-ionized plasma across the gap 244 to generate a strong electric field between the anode 238 and the cathode assembly 216. This strong electric field generates excited atoms in the weakly-ionized plasma. The excited atoms are rapidly ionized by secondary electrons emitted by the sputtering target 220. This rapid ionization results in a strongly-ionized plasma having a large ion density being formed in an area proximate to the cathode assembly 216.

Figure 4:
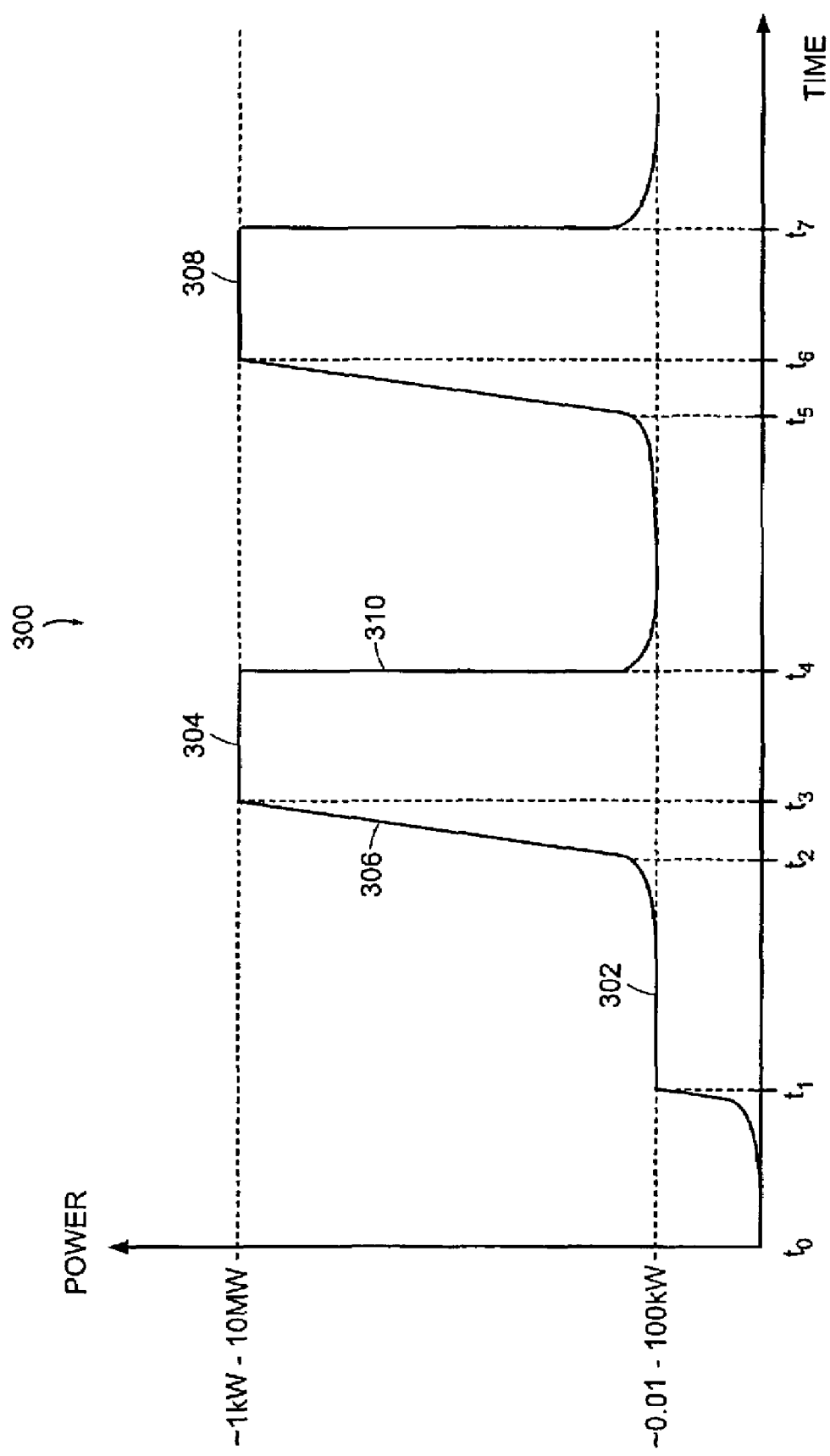
FIG. 4 illustrates a graphical representation of the applied power of a pulse as a function of time for periodic pulses applied to the plasma in the magnetron sputtering system of FIG. 2.

FIG. 4 illustrates a graphical representation 300 of the applied power of a pulse as a function of time for periodic pulses applied to the plasma in the magnetron sputtering system of FIG. 2. At time $t_0$, the feed gas from the gas source 208 flows into the chamber 202 before the pulsed power supply 234 is activated. The time required for a sufficient quantity of gas to flow from the gas source 208 into the chamber 202 depends on several factors including the flow rate of the gas and the desired pressure in the chamber 202.

In one embodiment (not shown), the pulsed power supply 234 is activated before the feed gas flows into the chamber 202. In this embodiment, the feed gas is injected between the anode 238 and the cathode assembly 216 where it is ignited by the pulsed power supply 234 to generate the weakly-ionized plasma.

In one embodiment, the feed gas flows between the anode 238 and the cathode assembly 216 between time $t_0$ and time $t_1$. At time $t_1$, the pulsed power supply 234 generates a pulse 302 between the cathode assembly 216 and the anode 238 that has a power level between about 0.01 kW and 100 kW depending on the size of the magnetron. The pulse 302 is sufficient to ignite the feed gas to generate the weakly-ionized plasma.

In another embodiment (not shown), the pulsed power supply 234 applies a potential in the gap 244 between the cathode assembly 216 and the anode 238 before the feed gas from the gas source 208 is delivered into the chamber 202. In this embodiment, the feed gas is ignited as it flows between the cathode assembly 216 and the anode 238. In another embodiment, the pulsed power supply 234 generates the pulse 302 between the cathode assembly 216 and the anode 238 when the feed gas from the gas source 208 is delivered into the chamber 202.

The power generated by the pulsed power supply 234 partially ionizes the gas that is located in the region 245 between the cathode assembly 216 and the anode 238. The partially ionized gas is also referred to as a weakly-ionized plasma or a pre-ionized plasma. As described herein, the formation of weakly-ionized plasma substantially eliminates the possibility of creating a breakdown condition when high-power pulses are applied to the weakly-ionized plasma.

In one embodiment, the power is continuously applied for between about one microsecond and one hundred seconds to allow the pre-ionized plasma to form and be maintained at a sufficient plasma density. In one embodiment, the power from the pulsed power supply 234 is continuously applied after the weakly-ionized plasma is ignited to maintain the weakly-ionized plasma. The pulsed power supply 234 can be designed so as to generate a continuous nominal power in order to generate and sustain the weakly-ionized plasma until a high-power pulse is delivered by the pulsed power supply 234.

At time $t_2$, the pulsed power supply 234 delivers a high-power pulse 304 across the weakly-ionized plasma. In some embodiments, the high-power pulse 304 has a power that is in the range of between about one kilowatt to ten megawatts depending on the size of the magnetron. The high-power pulse has a leading edge 306 with a rise time that is between about 0.1 microseconds and ten seconds The high-power pulse 304 has a power and a pulse width that is sufficient to transform the weakly-ionized plasma to a strongly-ionized plasma. In one embodiment, the high-power pulse 304 is applied for a time that is in the range of between about ten microseconds and ten seconds. At time $t_4$, the high-power pulse 304 is terminated.

The power supply 224 maintains the weakly-ionized plasma after the delivery of the high-power pulse 304 by applying background power that, in one embodiment, is between about 0.01 kW and 100 kW. The background power can be a pulsed or continuously applied power that maintains the pre-ionization condition in the plasma, while the pulsed power supply 234 prepares to deliver another high-power pulse 308.

At time $t_5$, the pulsed power supply 234 delivers another high-power pulse 308. The repetition rate between the high-power pulses 304, 308 is, in one embodiment, between about 0.1 Hz and 1 kHz. The particular size, shape, width, and frequency of the high-power pulses 304, 308 depend on various factors including process parameters, the design of the pulsed power supply 234, the size of the magnetron, and the design of the sputter system. The shape and duration of the leading edge 308 and the trailing edge 310 of the high-power pulse 304 is chosen to sustain the weakly-ionized plasma while controlling the rate of ionization of the strongly-ionized plasma. In one embodiment, the particular size, shape, width, and frequency of the high-power pulse 304 is chosen to control the rate of sputtering of the target material.

Figure 5:
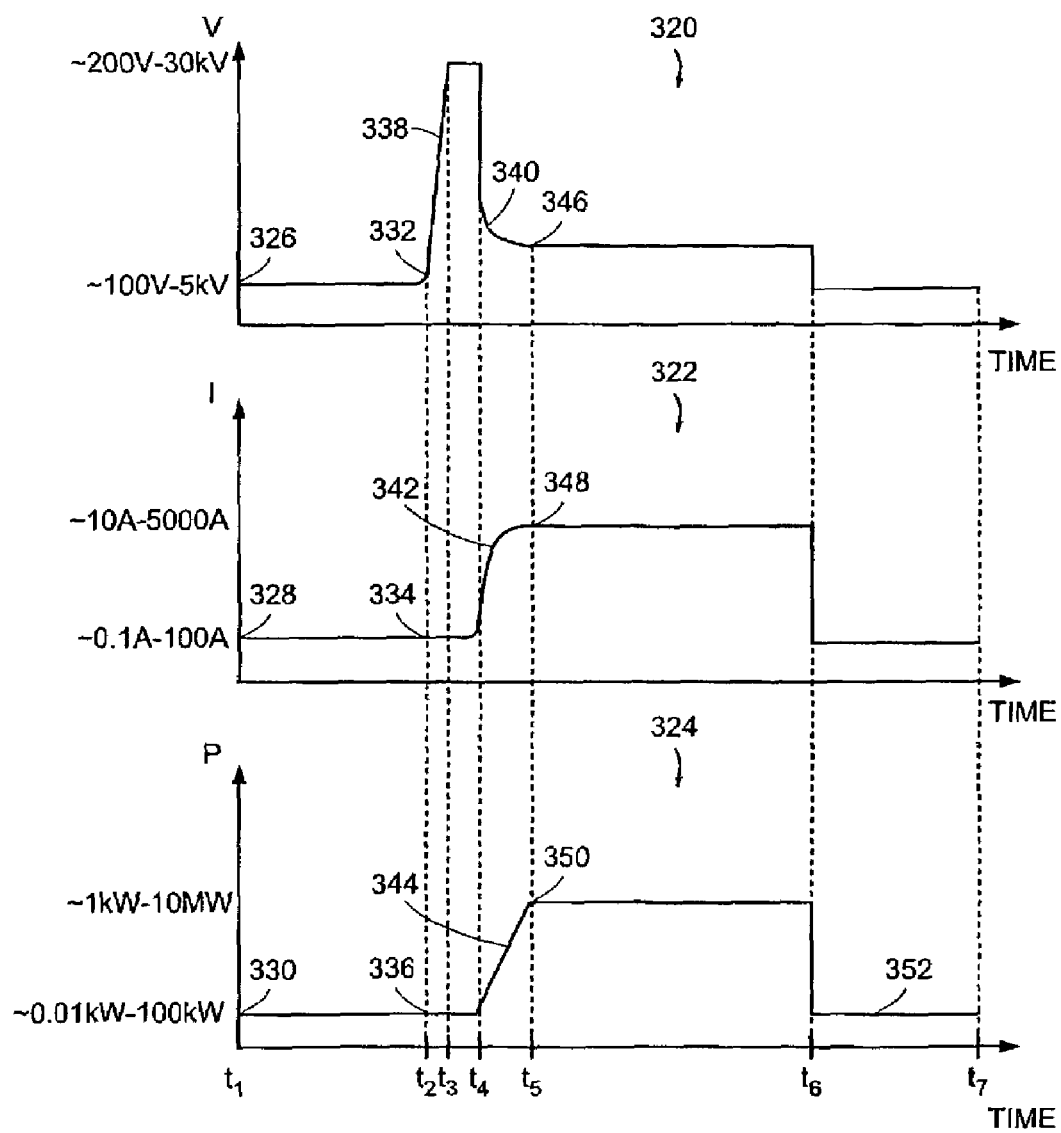
FIG. 5 illustrates graphical representations of the absolute value of applied voltage, current, and power as a function of time for periodic pulses applied to the plasma in the magnetron sputtering system of FIG. 2.

FIG. 5 illustrates graphical representations 320, 322, and 324 of the absolute value of applied voltage, current, and power, respectively, as a function of time for periodic pulses applied to the plasma in the magnetron sputtering system of FIG. 2. In one embodiment, at time $t_0$ (not shown), the feed gas from the gas source 208 flows into the chamber 202 before the pulsed power supply 234 is activated. The time required for a sufficient quantity of gas to flow from the gas source 208 into the chamber 202 depends on several factors including the flow rate of the gas and the desired pressure in the chamber 202.

In the embodiment shown in FIG. 5, the power supply 238 generates a constant power. At time $t_1$, the pulsed power supply 234 generates a voltage 326 across the anode 238 and the cathode assembly 216. In one embodiment, the voltage 326 is approximately between one hundred and two thousand volts. The period between time $t_0$ and time $t_1$ (not shown) can be on the order of several microseconds up to several milliseconds. At time $t_1$, the current 328 and the power 330 have constant value.

Between time $t_1$ and time $t_2$, the voltage 326, the current 328, and the power 326 remain constant as the weakly-ionized plasma is generated. The voltage 332 at time $t_2$ is between about 100V and 2,000V. The current 334 at time $t_2$ is between about 0.1 A and 100 A. The power 336 delivered at time $t_2$ is between about 0.01 kW and 100 kW.

The power 336 generated by the pulsed power supply 234 partially ionizes the gas that is located between the cathode assembly 216 and the anode 238. The partially ionized gas is also referred to as a weakly-ionized plasma or a pre-ionized plasma. As described herein, the formation of weakly-ionized plasma substantially eliminates the possibility of creating a breakdown condition when high-power pulses are applied to the weakly-ionized plasma. The suppression of this breakdown condition substantially eliminates the occurrence of undesirable arcing in the chamber 202.

In one embodiment, the period between time $t_1$ and time $t_2$ is between about one microsecond and one hundred seconds to allow the pre-ionized plasma to form and be maintained at a sufficient plasma density. In one embodiment, the power 336 from the pulsed power supply 234 is continuously applied to maintain the weakly-ionized plasma. The pulsed power supply 234 can be designed so as to output a continuous nominal power into order to sustain the weakly-ionized plasma.

Between time $t_2$ and time $t_3$, the pulsed power supply 234 delivers a large voltage pulse 338 across the weakly-ionized plasma. In some embodiments, the large voltage pulse 338 has a voltage that is in the range of two hundred to thirty thousand volts. In some embodiment, the period between time $t_2$ and time $t_3$ is between about 0.1 microseconds and ten seconds. The large voltage pulse 338 is applied between time $t_3$ and time $t_4$, before the current across the plasma begins to increase. In one embodiment, the time period between time $t_3$ and time $t_4$ can be between about one microsecond and ten seconds.

Between time $t_4$ and time $t_5$, the voltage 340 drops as the current 342 increases. The power 344 also increases between time $t_4$ and time $t_5$, until a quasi-stationary state exists between the voltage 346 and the current 348. The period between time $t_4$ and time $t_5$ can be on the order of one to one hundred microseconds.

In one embodiment, at time $t_5$, the voltage 346 is between about one hundred and thirty thousand volts, the current 348 is between about one hundred and five thousand amperes and the power 350 is between about one kilowatt and ten megawatts. The power 350 is continuously applied to the plasma until time $t_6$. In one embodiment, the period between time $t_5$ and time $t_6$ is approximately between one microsecond and ten seconds.

The pulsed power supply 234 delivers a high-power pulse having a maximum power 350 and a pulse width that is sufficient to transform the weakly-ionized plasma to a strongly-ionized plasma. At time $t_6$, the maximum power 350 is terminated. In one embodiment, the pulsed power supply 234 continues to supply a background power that is sufficient to maintain the plasma after time $t_6$.

In one embodiment, the power supply 234 maintains the plasma after the delivery of the high-power pulse by continuing to apply a power 352 that can be between about 0.01 kW and 100 kW to the plasma. The continuously generated power maintains the pre-ionization condition in the plasma, while the pulsed power supply 234 prepares to deliver the next high-power pulse.

At time $t_7$, the pulsed power supply 234 delivers the next high-power pulse (not shown). In one embodiment, the repetition rate between the high-power pulses is between about 0.1 Hz and 1 kHz. The particular size, shape, width, and frequency of the high-power pulses depend on various factors including process parameters, the design of the pulsed power supply 234, the size of the magnetron, and the design of the sputter system.

In another embodiment (not shown), the power supply 234 generates a constant voltage. In this embodiment, the applied voltage 320 is continuously applied from time $t_2$ until time $t_6$. The current 322 and the power 324 change to keep the applied voltage 320 constant. The current 322 and the power 224 rise until time $t_6$, where the voltage 320 is terminated.

FIG. 6A through FIG. 6D illustrate various simulated magnetic field distributions 400, 402, 404, and 406 that are proximate to the cathode assembly 116 for various electron ExB drift currents in the magnetron sputtering apparatus 200 of FIG. 2. The simulated magnetic fields distributions 400, 402, 404, and 406 indicate that high-power plasmas having high current density tend to diffuse homogeneously in the area 246 of the magnetron sputtering apparatus 200 of FIG. 2.

The high-power pulses between the cathode assembly 216 and the anode 238 generate secondary electrons from the cathode assembly 216 that move in a substantially circular motion proximate to the cathode assembly 216 according to crossed electric and magnetic fields. The substantially circular motion of the electrons generate an electron E×B drift current. The magnitude of the electron E×B drift current is proportional to the magnitude of the discharge current in the plasma and, in one embodiment, is approximately in the range of between about three and ten times the magnitude of the discharge current.

In one embodiment, the substantially circular electron E×B drift current generates a magnetic field that interacts with the magnetic field generated by the magnet assembly 252. In one embodiment, the magnetic field generated by the electron E×B drift current has a direction that is substantially opposite to the direction of the magnetic field generated by the magnet assembly 252. The magnitude of the magnetic field generated by the electron E×B drift current increases with increased electron E×B drift current. The homogeneous diffusion of the strongly-ionized plasma in the region 246 is caused, at least in part, by the interaction of the magnetic field generated by the magnet assembly 252 and the magnetic field generated by the electron E×B drift current.

In one embodiment, the electron E×B drift current defines a substantially circular shape for low current density plasma. However, as the current density of the plasma increases, the substantially circular electron E×B drift current tends to describe a more complex shape as the interaction of the magnetic field generated by the magnet assembly 252, the electric field generated by the high-power pulse, and the magnetic field generated by the electron E×B drift current becomes more acute. For example, in one embodiment, the electron E×B drift current has a substantially cycloidal shape. Thus, the exact shape of the electron E×B drift current can be quite elaborate and depends on various factors.

Figure 6A:
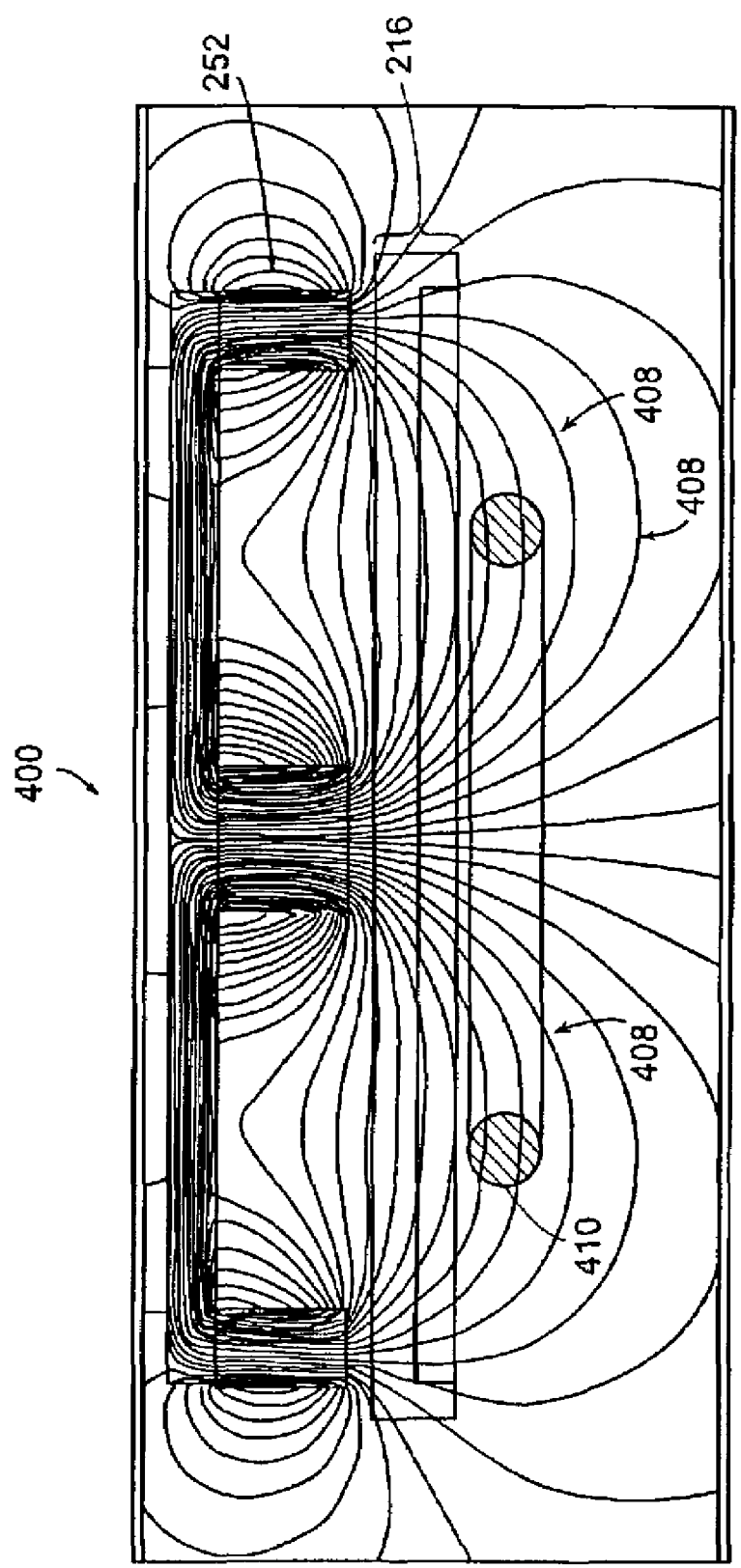
FIG. 6A through FIG. 6D illustrate various simulated magnetic field distributions proximate to the cathode assembly for various electron E×B drift currents according to the present invention.

For example, FIG. 6A illustrates the magnetic field lines 408 produced from the interaction of the magnetic field generated by the magnet assembly 252 and the magnetic field generated by an electron E×B drift current 410 illustrated by a substantially circularly shaped ring. The electron E×B drift current 410 is generated proximate to the cathode assembly 216.

In the example shown in FIG. 6A, the electron E×B drift current 410 is approximately one hundred amperes (100 A). In one embodiment of the invention, the electron E×B drift current 410 is between approximately three and ten times as great as the discharge current. Thus, in the example shown in FIG. 6A, the discharge current is approximately between 10 A and 30 A.

The magnetic field lines 408 shown in FIG. 6A indicate that the magnetic field generated by the magnet assembly 252 is substantially undisturbed by the relatively small magnetic field that is generated by the relatively small electron E×B drift current 410.

Figure 6B:
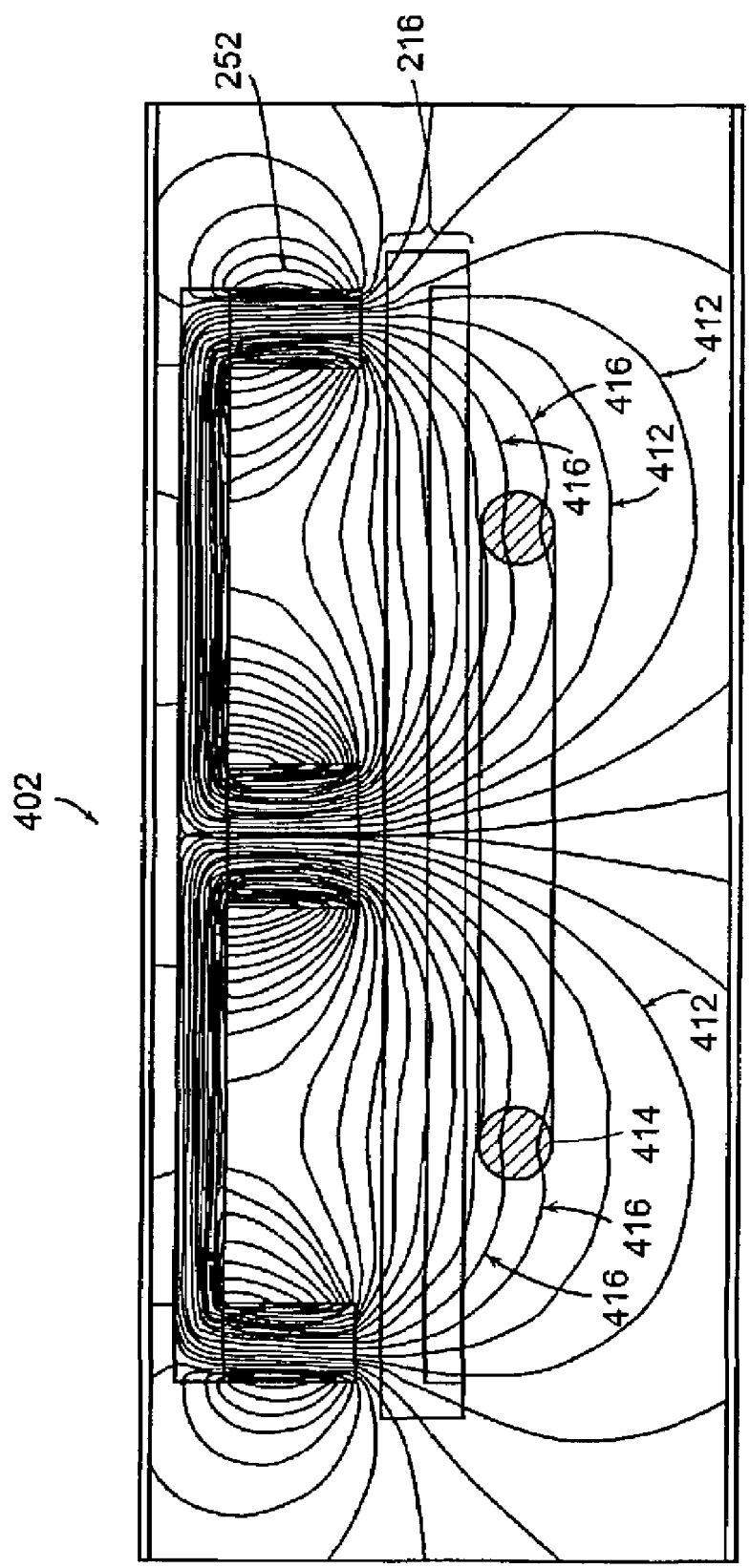

FIG. 6B illustrates the magnetic field lines 412 produced from the interaction of the magnetic field generated by the magnet assembly 252 and the magnetic field generated by an electron E×B drift current 414. The electron E×B drift current 414 is generated proximate to the cathode assembly 216.

In the example shown in FIG. 6B, the electron E×B drift current 414 is approximately 300 A. Since the electron E×B drift current 414 is typically between about three and ten times as great as the discharge current, the discharge current in this example is approximately between 30 A and 100 A.

The magnetic field lines 412 that are generated by the magnet assembly 252 are substantially undisturbed by the relatively small magnetic field generated by the relatively small electron E×B drift current 414. However, the magnetic field lines 416 that are closest to the electron E×B drift current 414 are somewhat distorted by the magnetic field generated by the electron E×B drift current 414. The distortion suggests that a larger electron E×B drift current should generate a stronger magnetic field that will interact more strongly with the magnetic field generated by the magnet assembly 252.

Figure 6C:
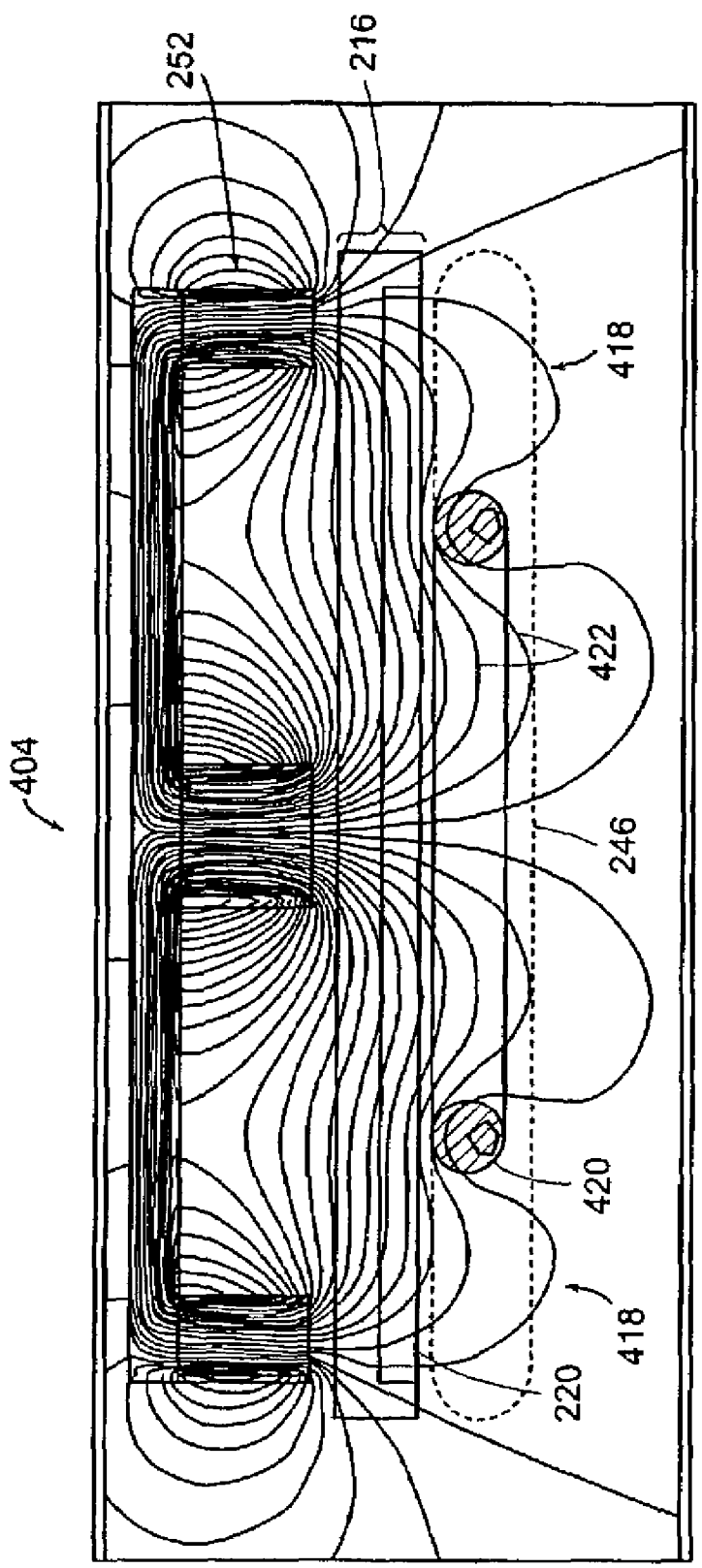

FIG. 6C illustrates the magnetic field lines 418 that are produced from the interaction of the magnetic field generated by the magnet assembly 252 and the magnetic field generated by an electron E×B drift current 420. The electron E×B drift current 420 is generated proximate to the cathode assembly 216.

In the example shown in FIG. 6C, the electron E×B drift current 420 is approximately 1,000 A. Since the electron E×B drift current 420 is typically between about three and ten times as great as the discharge current, the discharge current in this example is approximately between 100 A and 300 A.

The magnetic field lines 418 that are generated by the magnet assembly 252 exhibit substantial distortion that is caused by the relatively strong magnetic field generated by the relatively large electron E×B drift current 420. Thus, the larger electron E×B drift current 420 generates a stronger magnetic field that strongly interacts with and can begin to dominate the magnetic field generated by the magnet assembly 252.

The interaction of the magnetic field generated by the magnet assembly 252 and the magnetic field generated by the electron E×B drift current 420 substantially generates magnetic field lines 422 that are somewhat more parallel to the surface of the sputtering target 220 than the magnetic field lines 408, 412, and 416 in FIG. 6A and FIG. 6B. The magnetic field lines 422 allow the strongly-ionized plasma to more uniformly distribute itself in the area 246. Thus, the strongly-ionized plasma is substantially uniformly diffused in the area 246, and consequently, the sputtering target 220 is eroded more uniformly thereby resulting in higher target utilization than can be achieved than in conventional magnetron sputtering systems.

Figure 6D:
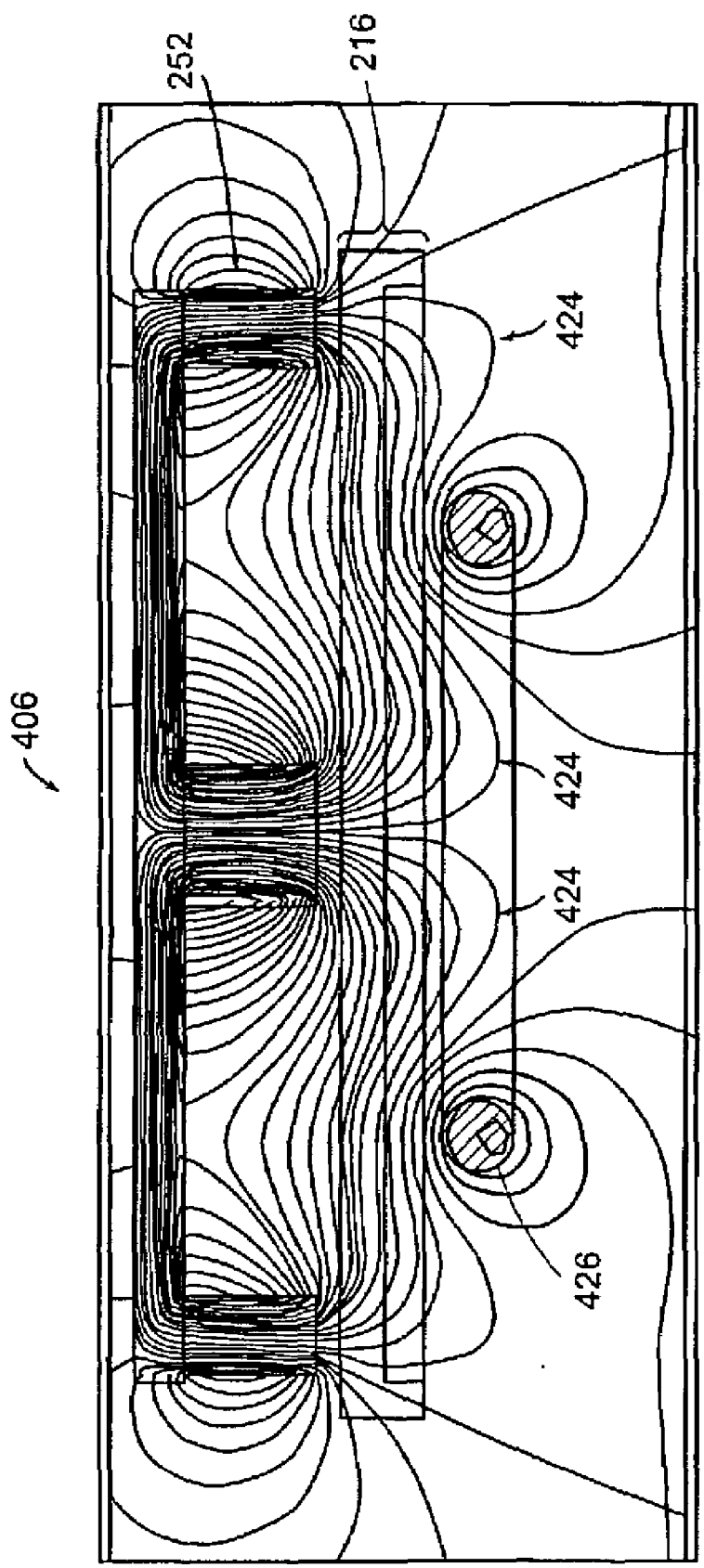

FIG. 6D illustrates the magnetic field lines 424 produced from the interaction of the magnetic field generated by the magnet assembly 252 and the magnetic field generated by an electron E×B drift current 426. The electron E×B drift current 426 is generated proximate to the cathode assembly 216.

In the example shown in FIG. 6D, the electron E×B drift current 426 is approximately 5,000 A. The discharge current in this example is approximately between 500 A and 1,700 A.

The magnetic field lines 424 generated by the magnet assembly 252 are relatively distorted due to their interaction with the relatively strong magnetic field generated by the relatively large electron E×B drift current 426. Thus, in this embodiment, the relatively large electron E×B drift current 426 generates a very strong magnetic field that is substantially stronger than the magnetic field generated by the magnet assembly 252.

Figure 7:
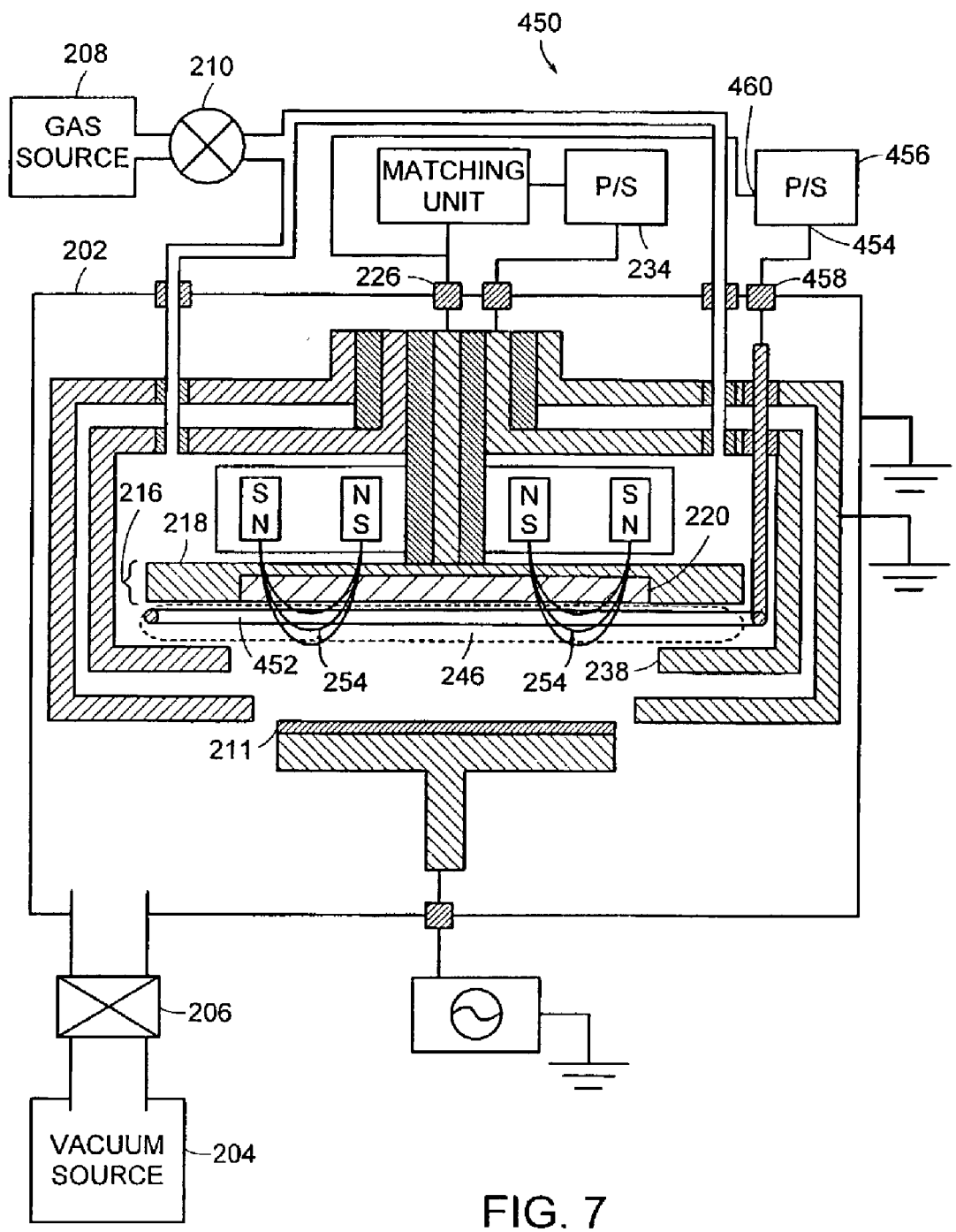
FIG. 7 illustrates a cross-sectional view of another embodiment of a magnetron sputtering apparatus according to the present invention.

FIG. 7 illustrates a cross-sectional view of another embodiment of a magnetron sputtering apparatus 450 according to the present invention. The magnetron sputtering apparatus 450 includes an electrode 452 that generates a weakly-ionized or pre-ionized plasma. The electrode 452 is also referred to as a pre-ionizing filament electrode and is a component in an ionization source that generates the weakly ionized plasma.

In one embodiment, the electrode 452 is coupled to an output 454 of a power supply 456. The power supply 456 can be a DC power supply or an AC power supply. An insulator 458 isolates the electrode 452 from the grounded wall of the chamber 202. In one embodiment, the electrode 452 is substantially shaped in the form of a ring electrode. In other embodiments, the electrode 452 is substantially shaped in a linear form or any other shape that is suitable for pre-ionizing the plasma.

In one embodiment, a second output 460 of the power supply 456 is coupled to the cathode 218. The insulator 226 isolates the cathode 218 from the grounded wall of the chamber 202. In one embodiment, the power supply 456 generates an average output power that is in the range of between about 0.01 kW and 100 kW. Such an output power is sufficient to generate a suitable current between the electrode 452 and the cathode assembly 216 to pre-ionize feed gas that is located proximate to the electrode 452.

In operation, the magnetron sputtering apparatus 450 functions in a similar manner to the magnetron sputtering apparatus 200 of FIG. 2, but with some operational differences. The magnetic field 254 is generated proximate to the cathode assembly 216. In one embodiment, the strength of the magnetic field 254 is between about one hundred and two thousand gauss. The feed gas is supplied from the gas source 208 to the chamber 202 by the gas flow control system 210.

The power supply 456 applies a suitable current between the cathode assembly 216 and the electrode 452. The parameters of the current are chosen to establish a weakly-ionized plasma in the area 246 proximate to the electrode 452. In one embodiment, the power supply 456 generates a voltage of between about one hundred volts and five thousand volts with a discharge current that is between about 0.1 A and 100 A depending on the size of the magnetron. An example with specific parameters will be discussed herein in more detail in connection with FIG. 8.

In one embodiment, the resulting pre-ionized plasma density is in the range between approximately $10^6$ and $10^{12}$ $cm^{-3}$ for argon sputtering gas. In one embodiment, the pressure in the chamber 202 is in the range of approximately $10^{-3}$ to 10 Torr. As previously discussed, the weakly-ionized or pre-ionized plasma reduces or substantially eliminates the possibility of establishing a breakdown condition in the chamber 202 when high-power pulses are applied to the plasma.

The pulsed power supply 234 then generates a high-power pulse between the cathode assembly 216 and the anode 238. The high-power pulse generates a strongly-ionized plasma from the weakly-ionized plasma. The parameters of the high-power pulse depend on various parameters including the size of the magnetron, the desired deposition rate, and the concentration of the pre-ionized plasma necessary for depositing the target material.

In one embodiment, the high-power pulse between the cathode assembly 216 and the anode 238 is in the range of about one kilowatt to about ten megawatts. This corresponds to target densities on the order of several kilowatts per square centimeter. In one embodiment, the ion current density that can be generated from the strongly-ionized plasma is greater than about one ampere per squared centimeter for a pressure of approximately ten mTorr.

In one embodiment, the high-power pulse has a pulse width that is in the range of approximately one microsecond to several seconds. In one embodiment, the repetition rate of the high-power discharge is in the range of between about 0.1 Hz to 1 kHz. In one embodiment, in order to minimize undesirable target heating, the average power generated by the pulsed power supply is less than one megawatt depending on the size of the magnetron. In one embodiment, the thermal energy in the sputtering target 220 is conducted away or dissipated by liquid or gas cooling (not shown).

The gas flow control system 210 provides a feed gas flow rate that is high enough to maintain the strongly-ionized plasma. Additionally, the vacuum control system 206 controls the pressure so as to maintain the pressure inside the chamber 202 in a range that supports the strongly-ionized plasma.

The ions in the strongly-ionized plasma accelerate towards the sputtering target 220 at high velocity and impact the surface of the sputtering target 220. The strongly ionized plasma causes a very high sputtering rate of the target material. Furthermore, as described herein in connection with FIG. 6A though FIG. 6D, the strongly-ionized plasma generated by the sputtering systems according to the present invention tends to diffuse homogenously in the area 246 due to the interaction of generated magnetic fields. This homogenous diffusion results in a more uniform distribution of ions impacting the surface of the target material 220 compared with conventional magnetron sputtering systems, thereby resulting in relatively high target utilization and relatively uniform deposition of target material on the substrate 211.

Figure 8:
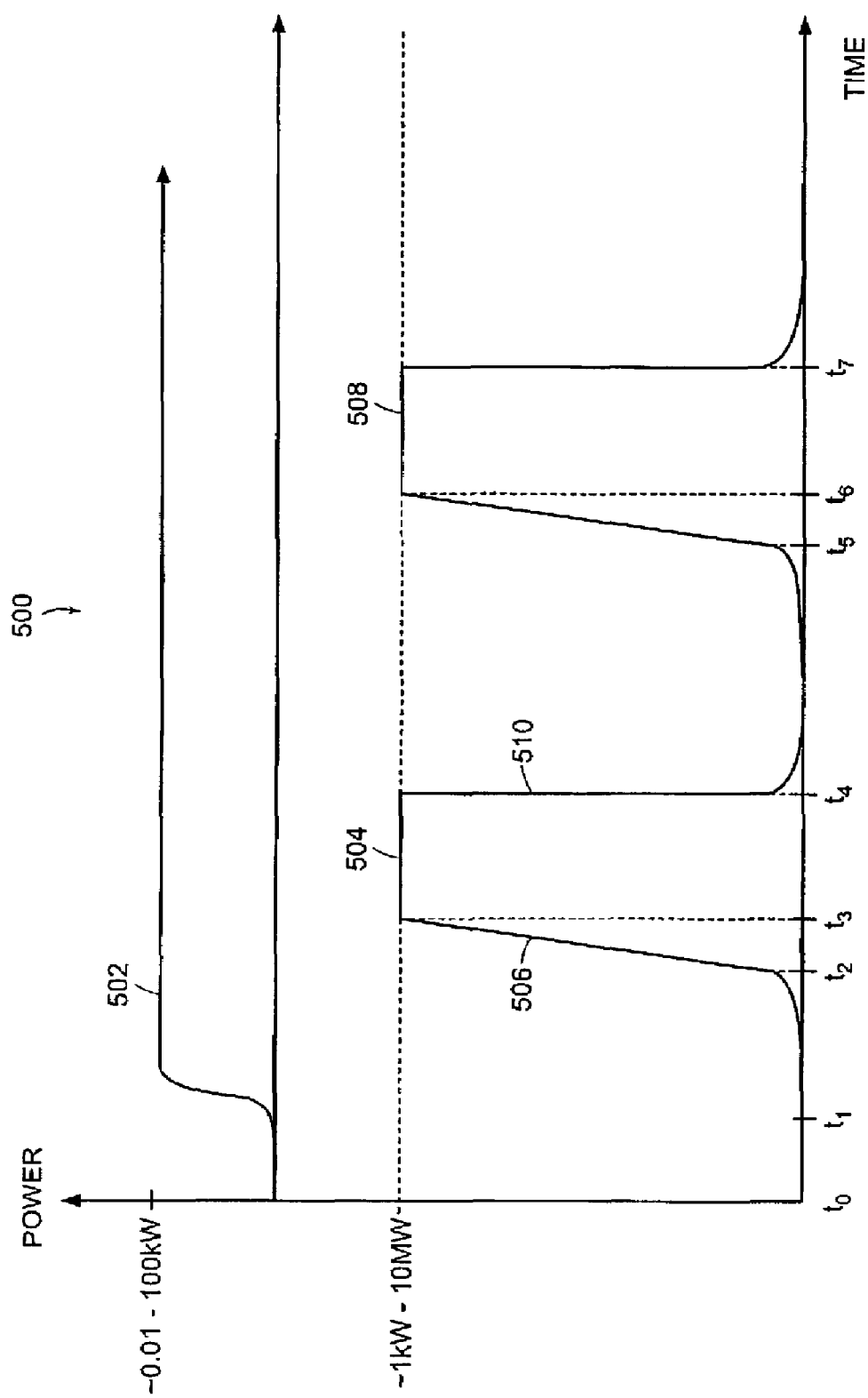
FIG. 8 illustrates a graphical representation of pulse power as a function of time for periodic pulses applied to the plasma in the magnetron sputtering system of FIG. 7.

FIG. 8 illustrates a graphical representation of pulse power as a function of time for periodic pulses applied to the plasma in the magnetron sputtering system of FIG. 7. In one embodiment, the feed gas from the gas source 208 flows into the chamber 202 at time $t_0$, before either the power supply 456 or the pulsed power supply 234 are activated.

In another embodiment, prior to the formation of the weakly-ionized plasma, the power supply 456 and/or the pulsed power supply 234 are activated at time $t_0$ before the gas enters the chamber 202. In this embodiment, the feed gas is injected between the electrode 452 and the cathode assembly 216 where it is ignited by the power supply 456 to generate the weakly-ionized plasma.

The time required for a sufficient quantity of gas to flow into the chamber 202 depends on several factors including the flow rate of the gas and the desired operating pressure in the chamber 202. At time $t_1$, the power supply 456 generates a power 502 that is in the range of between about 0.01 kW to about 100 kW between the electrode 452 and the cathode assembly 216. The power 502 causes the gas proximate to the electrode 452 to become partially ionized, thereby generating a weakly-ionized plasma or a pre-ionized plasma.

At time $t_2$, the pulsed power supply 234 delivers a high-power pulse 504 to the weakly-ionized plasma that is on the order of less than one kilowatt to about ten megawatts depending on the size of the magnetron. The high-power pulse 504 is sufficient to transform the weakly-ionized plasma to a strongly-ionized plasma. The high-power pulse has a leading edge 506 having a rise time that is between about 0.1 microseconds and ten seconds.

In one embodiment, the pulse width of the high-power pulse 504 is in the range of between about one microsecond and ten seconds. The high-power pulse 504 is terminated at time $t_4$. Even after the delivery of the high-power pulse 504, the power 502 from the power supply 456 is continuously applied to sustain the pre-ionized plasma, while the pulsed power supply 234 prepares to deliver another high-power pulse 508. In another embodiment (not shown), the power supply 456 is an AC power supply and delivers suitable power pulses to ignite and sustain the weakly-ionized plasma.

At time $t_5$, the pulsed power supply 234 delivers another high-power pulse 508. In one embodiment, the repetition rate of the high-power pulses can be between about 0.1 Hz and 1 kHz. The particular size, shape, width, and frequency of the high-power pulse depend on the process parameters and on the design of the pulsed power supply 234 and the sputter system. The shape and duration of the leading edge 506 and the trailing edge 510 of the high-power pulse 504 is chosen to control the rate of ionization of the strongly-ionized plasma. In one embodiment, the particular size, shape, width, and frequency of the high power pulse 504 is chosen to control the rate of sputtering of the target material.

Figure 9B:
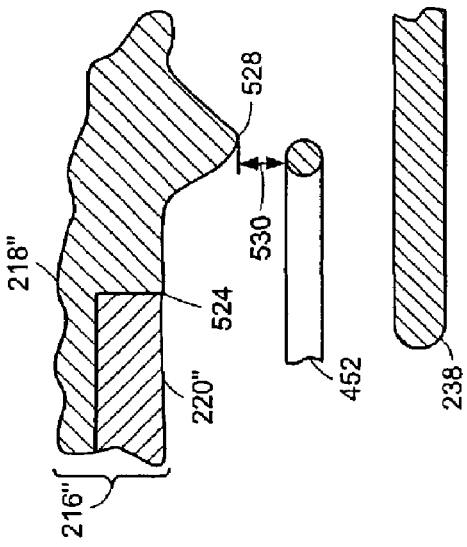
FIG. 9A through FIG. 9C are cross-sectional views of various embodiments of cathode assemblies according to the present invention.
Figure 9C:
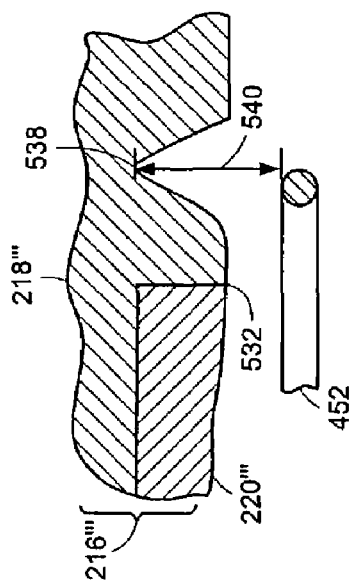
Figure 9A:
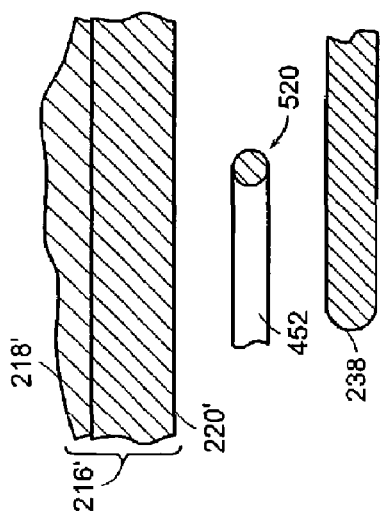

FIG. 9A through FIG. 9C are cross-sectional views of various embodiments of cathode assemblies 216', 216", and 216''' according to the present invention. FIG. 9A through FIG. 9C illustrate one side (the right side with reference to FIG. 7) of each cathode assembly. The left side of each cathode assembly is generally symmetrical to the illustrated right side. FIG. 9A through FIG. 9C illustrate various configurations of the electrode 452 and the cathode assemblies 216', 216", and 216'''. These various configurations can affect the parameters of the electric field generated between the electrode 452 and each of the cathode assemblies 216', 216", and 216'''. The parameters of the electric field can influence the ignition of the pre-ionized plasma as well as the pre-ionization process generally. In one embodiment, these various embodiments create the necessary conditions for breakdown of the feed gas and ignition of the weakly-ionized plasma in the region between the anode 238 and each respective cathode assembly 216', 216", and 216'''.

FIG. 9A illustrates one side of the cathode assembly 216'. In this embodiment, a sputtering target 220' is substantially positioned in contact with a cathode 218'. The sputtering target 220' extends past the bend 520 of the ring-shaped electrode 452. In this embodiment, the electric field lines (not shown) from the electric field generated between the cathode assembly 216' and the ring-shaped electrode 452 are substantially perpendicular to the cathode assembly 216' along the circumference of the ring-shaped electrode 452. This embodiment can increase the efficiency of the pre-ionization process. Furthermore, since the cathode 218' is never directly exposed to the plasma, ions from the plasma do not bombard the cathode 218' and therefore, any contamination that could otherwise be generated by the cathode material is substantially reduced.

FIG. 9B illustrates one side of the cathode assembly 216". In this embodiment, a sputtering target 220" is substantially positioned in contact with a cathode 218". The sputtering target 220" extends to the point 524 on the cathode assembly 216". In this embodiment, the electric field lines (not shown) generated between the cathode assembly 216" and the electrode 452 are substantially perpendicular to the cathode assembly 216" at the point 528 on the cathode 218". The electric field in the gap 530 between the electrode 452 and the cathode 218" is adapted to ignite the plasma from the feed gas flowing through the gap 530. Depending on various parameters such as where the magnetic field is generated relative to the sputtering target 220" and the pressure in the area proximate to the cathode assembly 216", this embodiment can increase the efficiency of the pre-ionization process.

FIG. 9C illustrates one side of the cathode assembly 216'''. In this embodiment, a sputtering target 220''' is substantially positioned in contact with a cathode 218'''. The sputtering target 220''' extends to position 532 on the cathode assembly 216'''. In this embodiment, the electric field lines (not shown) generated between the cathode assembly 216''' and the electrode 452 are substantially perpendicular to the cathode assembly 216''' at the position 538. The electric field in the gap 540 between the electrode 452 and the cathode 218''' is adapted to ignite the plasma from the feed gas flowing through the gap 540. Depending on various parameters such as where the magnetic field is generated relative to the sputtering target 220''' and the pressure in the area proximate to the cathode assembly 216''', this embodiment can increase the efficiency of the pre-ionization process.

Figure 10:
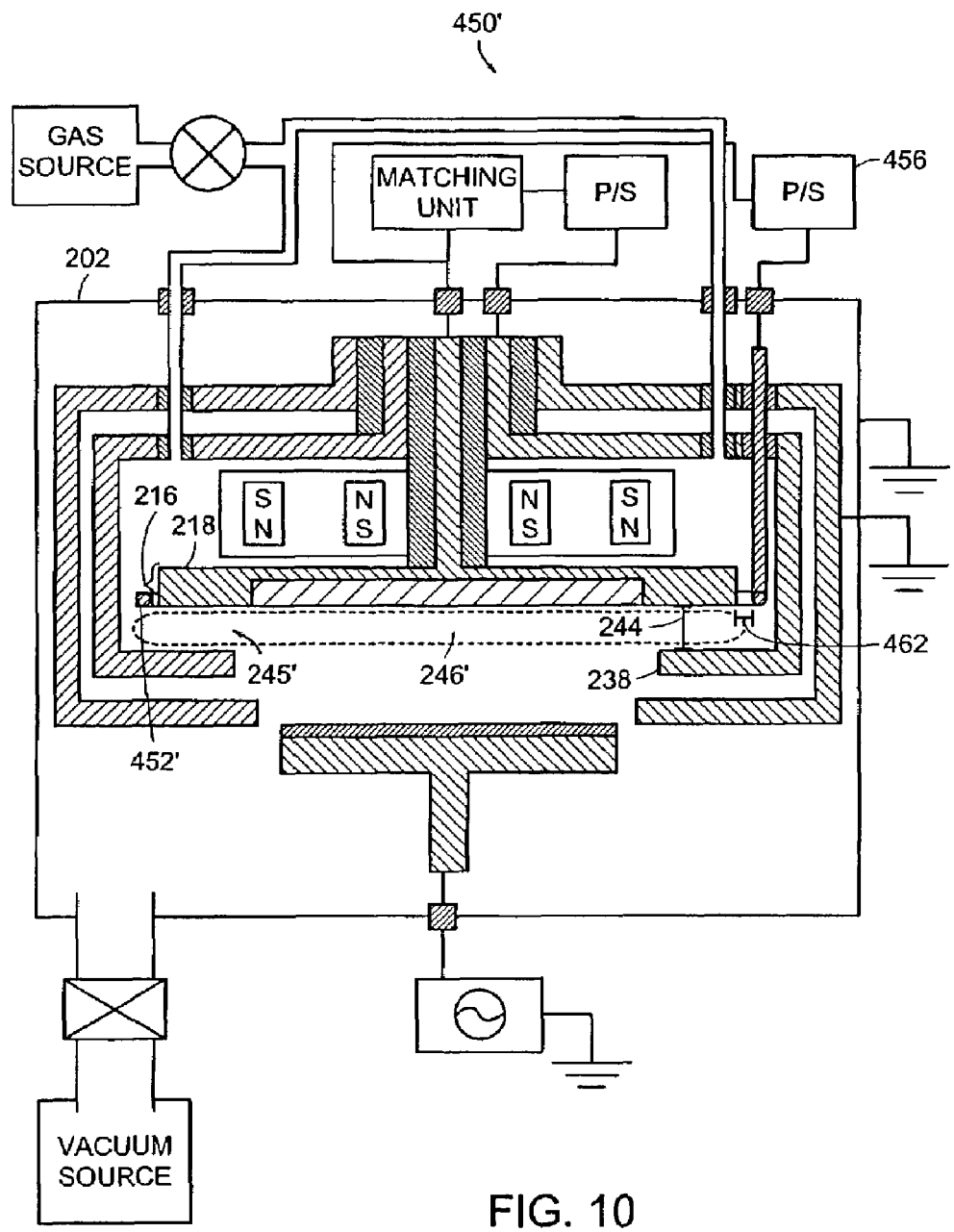
FIG. 10 illustrates a cross-sectional view of another illustrative embodiment of a magnetron sputtering apparatus according to the present invention.

FIG. 10 is a cross-sectional view of another embodiment of a magnetron sputtering apparatus 450' according to the present invention. This embodiment is similar to the magnetron sputtering apparatus 450 of FIG. 7. However, in this embodiment, the electrode 452', which is a component of the ionization source, substantially surrounds the cathode assembly 216. The position of the electrode 452' relative to the cathode assembly 216 is chosen to achieve particular electrical conditions in the gap 244 between the anode 238 and the cathode assembly 216. For example, in this embodiment, since the pre-ionizing electrode 452' is not physically located in the region 245' between the anode 238 and the cathode assembly 216, it does not interfere with the strong electric field that results when a high-power pulse is applied between the anode 238 and the cathode assembly 216. Additionally, the location of the pre-ionizing electrode 452' results in a more uniformly distributed weakly-ionized plasma in the region 246'.

The power supply 456 applies a substantially constant voltage between the cathode assembly 216 and the electrode 452'. The substantially constant voltage generates a weakly-ionized or pre-ionized plasma proximate to the electrode 452' and the cathode assembly 216. The pre-ionized plasma substantially eliminates the possibility of establishing a breakdown condition in the chamber 202 when high-power pulses are applied to the plasma. In one embodiment, the power supply 456 is a DC power supply that generates a DC voltage that is in the range of between about one hundred volts and several kilovolts with a discharge current that is in the range of between about 0.1 A and 100 A. In another embodiment, the power supply 456 is an AC power supply that generates voltage pulses between the cathode assembly 216 and the electrode 452'.

Since the electrode 452' substantially surrounds the cathode assembly 216, a distance 462 between the electrode 452' and the cathode 218 can be varied by changing the diameter of the electrode 452'. For example, the distance 462 can be varied from about 0.1 cm to about 10 cm. The distance 462 is optimized to generate sustainable weakly-ionized plasma in the region 246'. The vertical position of the electrode 452' relative to the cathode assembly 216 can also be varied.

Figure 11:
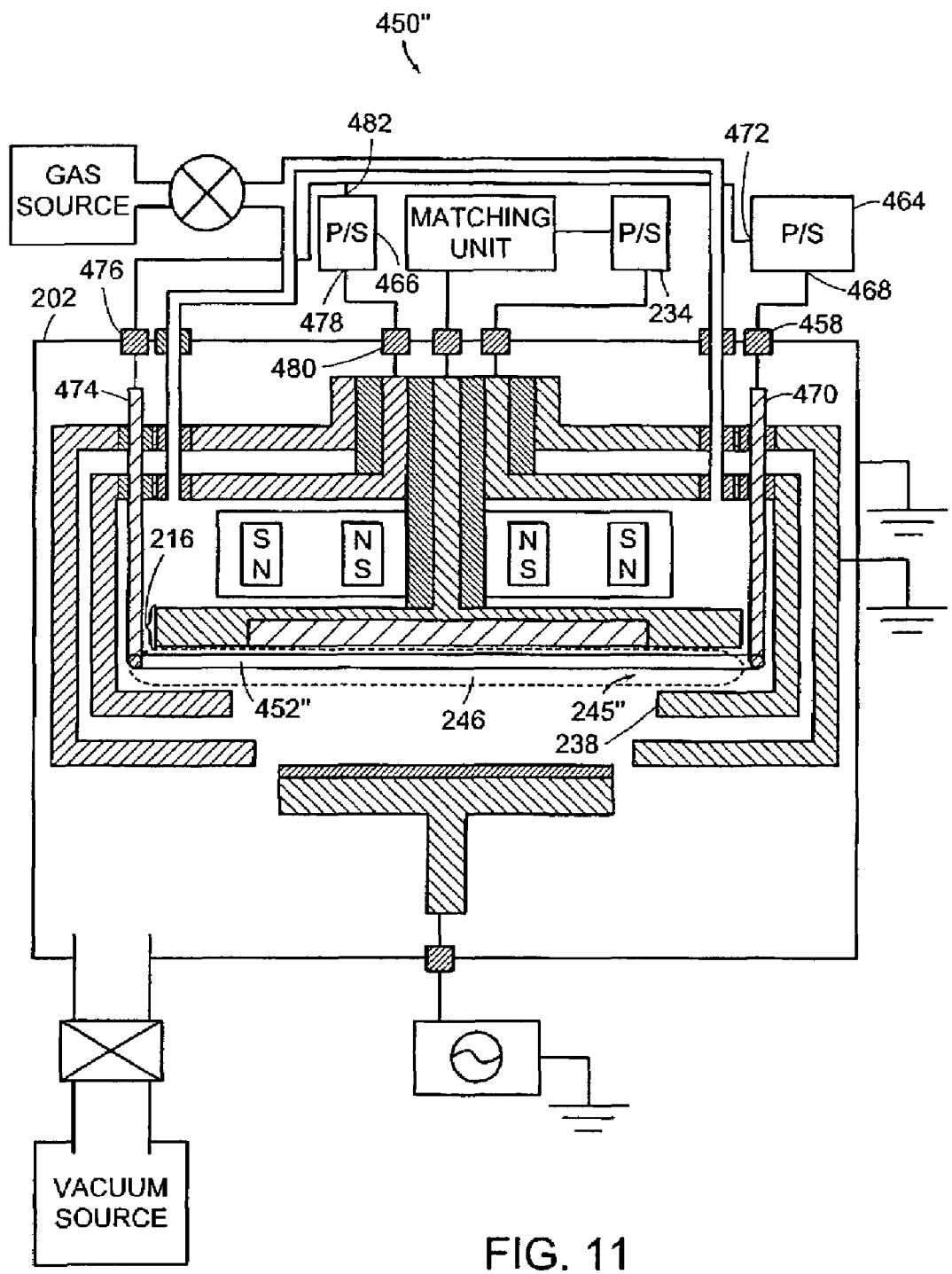
FIG. 11 is a cross-sectional view of another illustrative embodiment of a magnetron sputtering apparatus according to the present invention.

FIG. 11 illustrates a cross-sectional view of another illustrative embodiment of a magnetron sputtering apparatus 450" according to the present invention. The magnetron sputtering apparatus 450" is similar to the magnetron sputtering apparatus 450 of FIG. 7. The electrode 452" is a component of an ionization source. However, the electrode 452" is coupled to a first power supply 464 and also to an additional second power supply 466. The position of the electrode 452" relative to the cathode assembly 216 is chosen to achieve particular sputtering characteristics.

A first output 468 of the first power supply 464 is coupled through the insulator 458 to a first side 470 of the electrode 452". A second output 472 of the first power supply 464 is coupled to a second side 474 of the electrode 452" through an insulator 476. The first power supply 464 is adapted to generate a current through the electrode 452". The current essentially generates heat in the electrode 452". The heated electrode 452" emits electrons in the area 245".

In one embodiment, the first power supply 464 is a DC power supply and applies a substantially constant current through the electrode 452". In another embodiment, the first power supply 464 is an AC power supply.

A first output 478 of the second power supply 466 is coupled to the anode 238 through an insulator 480. A second output 482 of the second power supply 466 is coupled to the second side 474 of the electrode. The second power supply 466 is adapted to apply a voltage between the electrode 452" and the anode 238. The second power supply 466 can be an AC power supply or a DC power supply. In one embodiment, the second power supply 466 generates a voltage in the range of about one hundred volts and several kilovolts with a discharge current that is in the range of between about 0.1 A and 10 A.

In one embodiment, the second power supply 466 applies a substantially constant voltage that generates a weakly-ionized or pre-ionized plasma proximate to the electrode 452" and the cathode assembly 216. The pre-ionized plasma substantially eliminates the possibility of establishing a breakdown condition in the chamber 202 when high-power pulses are applied to the plasma.

The pulsed power supply 234 then generates a high-power pulse between the cathode assembly 216 and the anode 238. The high-power pulse generates a strongly-ionized plasma from the weakly-ionized plasma. The parameters of the high-power pulse depend on various parameters including the size of the magnetron, the desired deposition rate, and the concentration of the pre-ionized plasma necessary for depositing the target material, for example.

Figures 12, 12A:
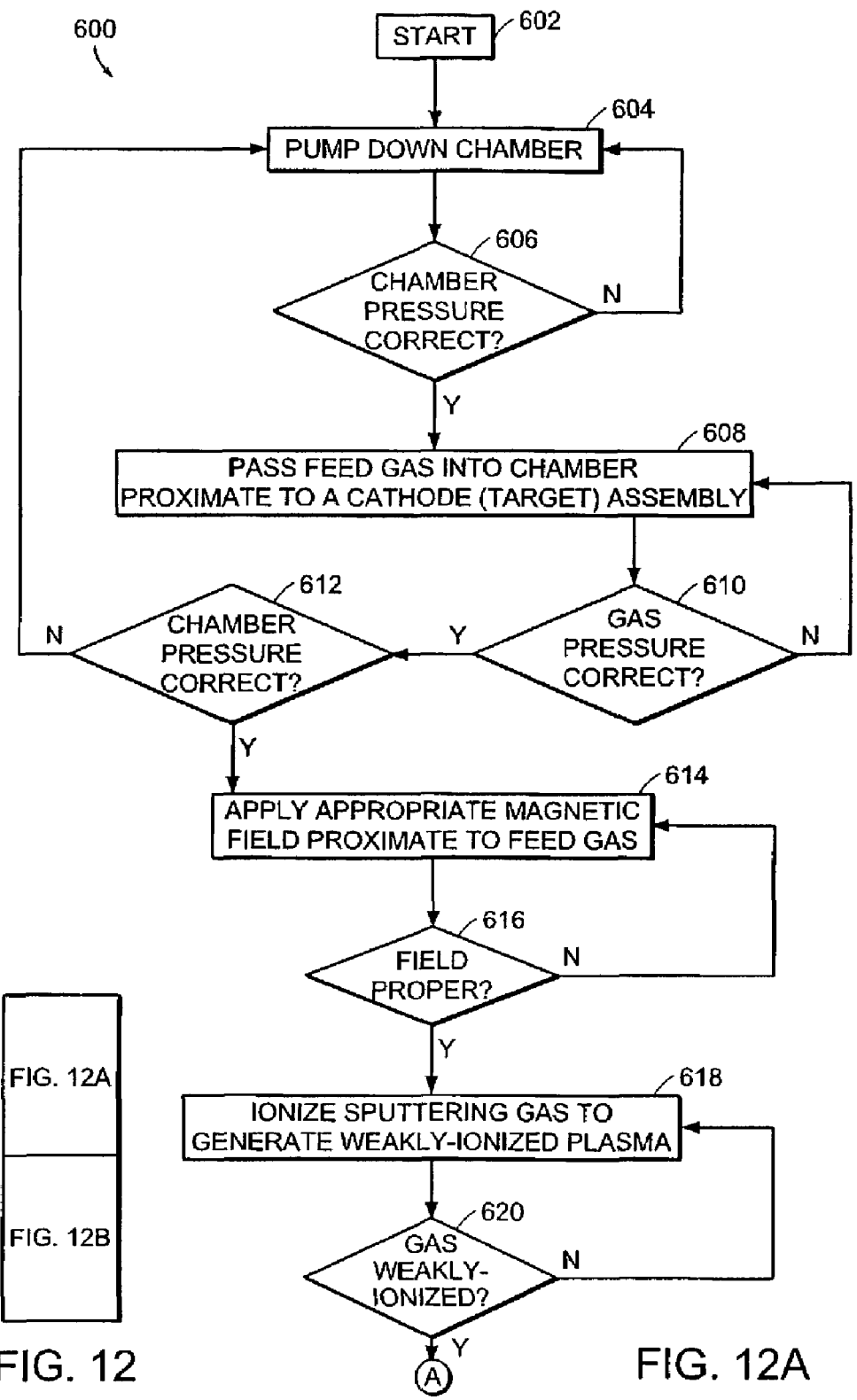
FIG. 12 is a flowchart of an illustrative process of sputter deposition according to the present invention.
Figure 12B:
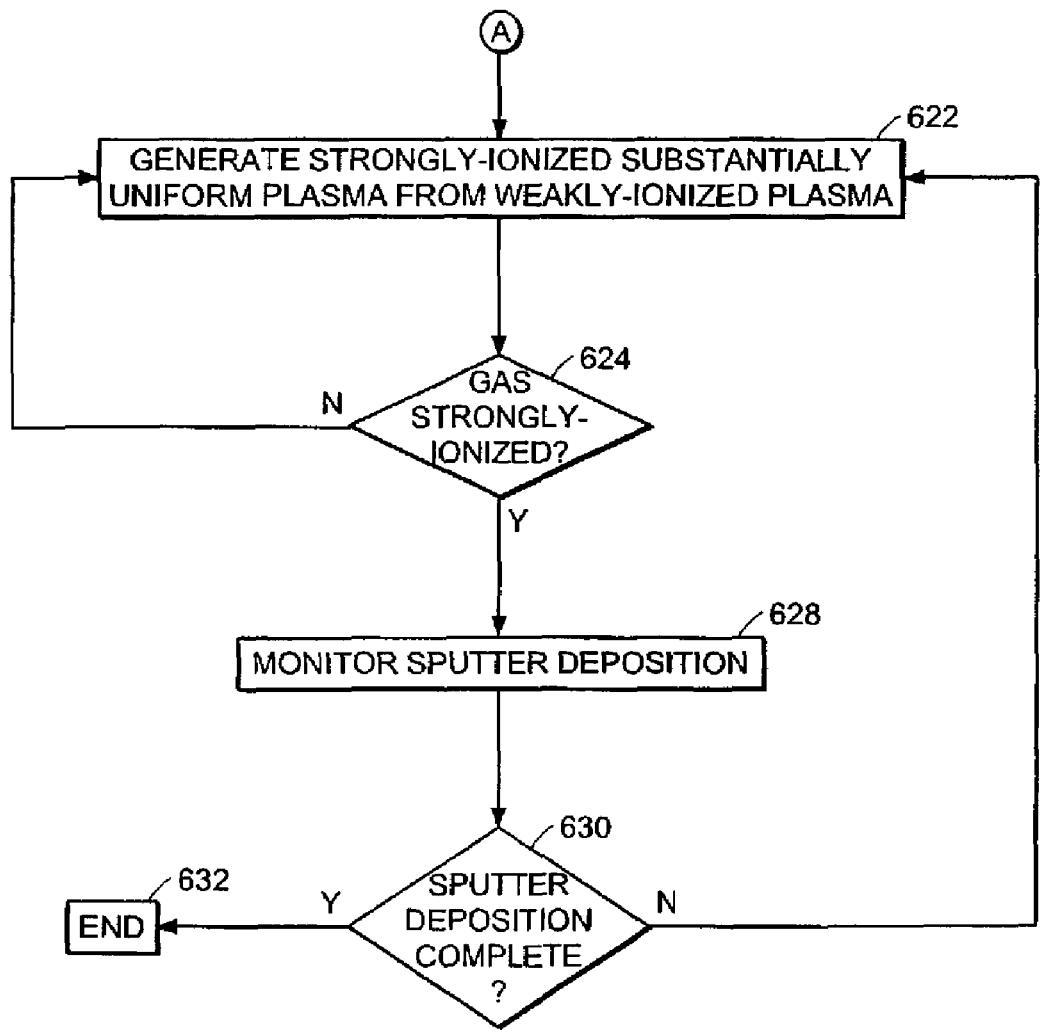

FIG. 12 is a flowchart 600 of an illustrative process of sputter deposition according to the present invention. The process is initiated (step 602) by activating various systems in the magnetron sputtering apparatus 200 of FIG. 2. For example, the chamber 202 is initially pumped down to a specific pressure (step 604). Next, the pressure in the chamber 202 is checked (step 606). In one embodiment, feed gas is then pumped into the chamber (step 608). The gas pressure is then checked (step 610). If the gas pressure is correct, the chamber pressure is then re-checked (step 612). If the chamber pressure is correct, an appropriate magnetic field is generated proximate to the feed gas (step 614). In one embodiment, the magnet assembly 252 of FIG. 2 includes at least one permanent magnet, where magnetic field is generated constantly, even before the process is initiated. In another embodiment, a magnetic assembly (not shown) includes at least one electromagnet, where the magnetic field is generated only when the electromagnet is operating.

When the magnetic field is appropriate (step 616), the feed gas is ionized to generate a weakly-ionized plasma (step 618). In one embodiment, the weakly-ionized plasma can be generated by creating a relatively low current discharge in the gap 244 between the cathode assembly 216 and the anode 238 of FIG. 2. In another embodiment, the weakly-ionized plasma can be generated by creating a relatively low current discharge between the electrode 452 and the cathode assembly 216 of FIG. 7. In yet another embodiment, the electrode 452" is heated to emit electrons proximate to the cathode assembly 216 of FIG. 11. In the embodiment of FIG. 11, a relatively low current discharge is created between the anode 238 and the electrode 452".

In the embodiment shown in FIG. 2, the weakly-ionized plasma is generated by applying a potential across the gap 244 between the cathode assembly 216 and the anode 238 before the introduction of the feed gas. In the embodiment shown in FIG. 7, the weakly-ionized plasma is generated by applying a potential difference between the electrode 452 and the cathode assembly 216 before the introduction of the feed gas to generate the weakly-ionized plasma.

When the gas is weakly ionized (step 620), a strongly-ionized plasma is generated from the weakly-ionized plasma (step 622). In one embodiment, the strongly-ionized plasma is generated by applying a high-power pulse in the gap 244 between the cathode assembly 216 and the anode 238. As previously discussed, the high-power pulse results in a strong electric field being generated in the gap 244 between the anode 238 and the cathode assembly 216. The strong electric field results in a stepwise ionization process. In one embodiment, the strongly-ionized plasma is substantially homogeneous in the area 246 of FIG. 2. This homogeneity results in substantially uniform erosion of the sputtering target 220 and, therefore, relatively high sputtering target utilization.

The cathode assembly 216 attracts ions from the strongly-ionized substantially uniform plasma because the cathode assembly 216 is negatively biased relative to the anode 238. This causes the ions to bombard the cathode assembly 216 causing sputtering of the target material.

In one embodiment, the sputter deposition is monitored (step 628) by known monitoring techniques. Once the sputter deposition is completed (step 630), the sputter process is ended (step 632).

Figures 13, 13A:
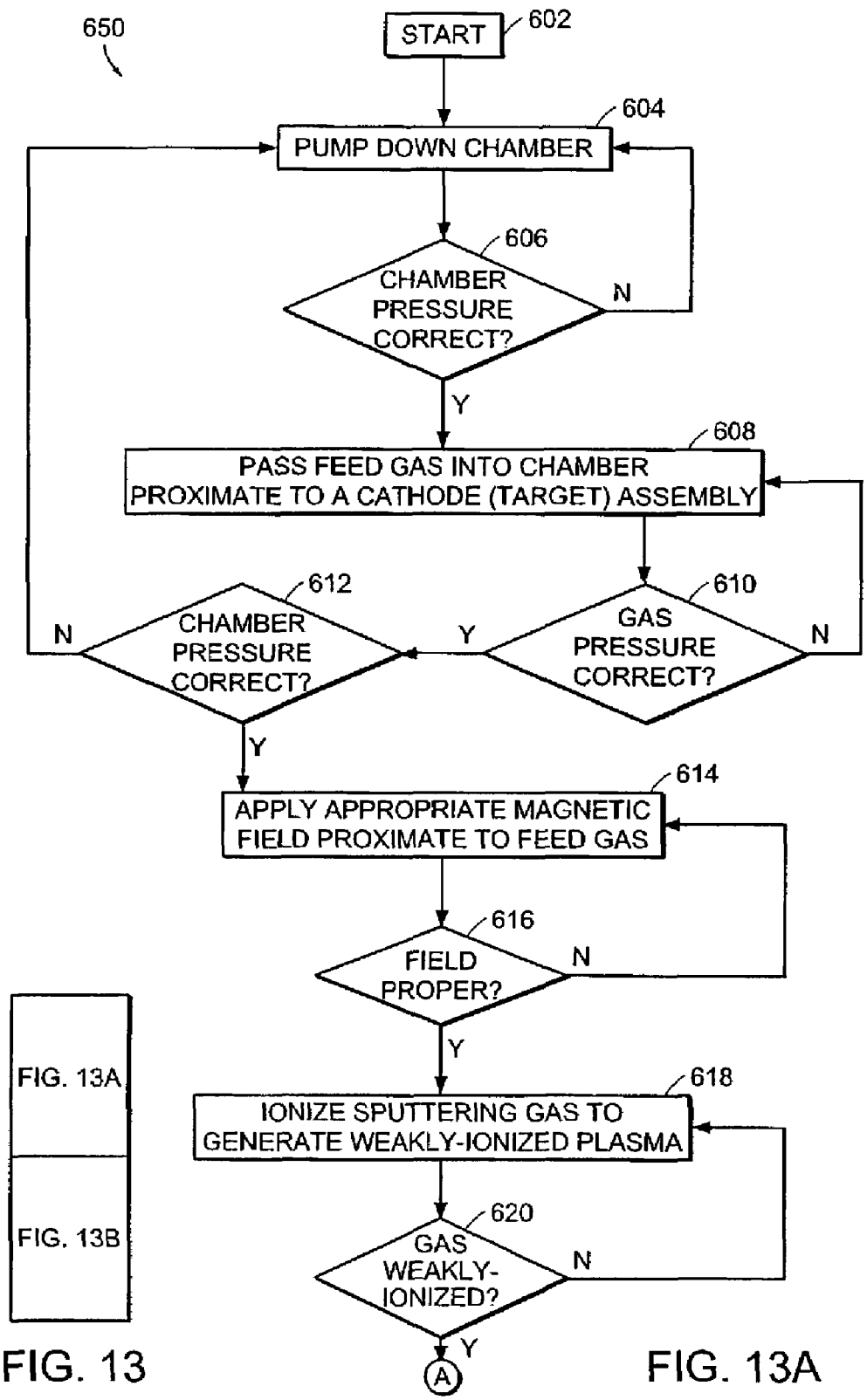
FIG. 13 includes FIGS.13 A and 13 B which is a flowchart of an illustrative process of controlling sputtering rate according to the present invention.
Figure 13B:
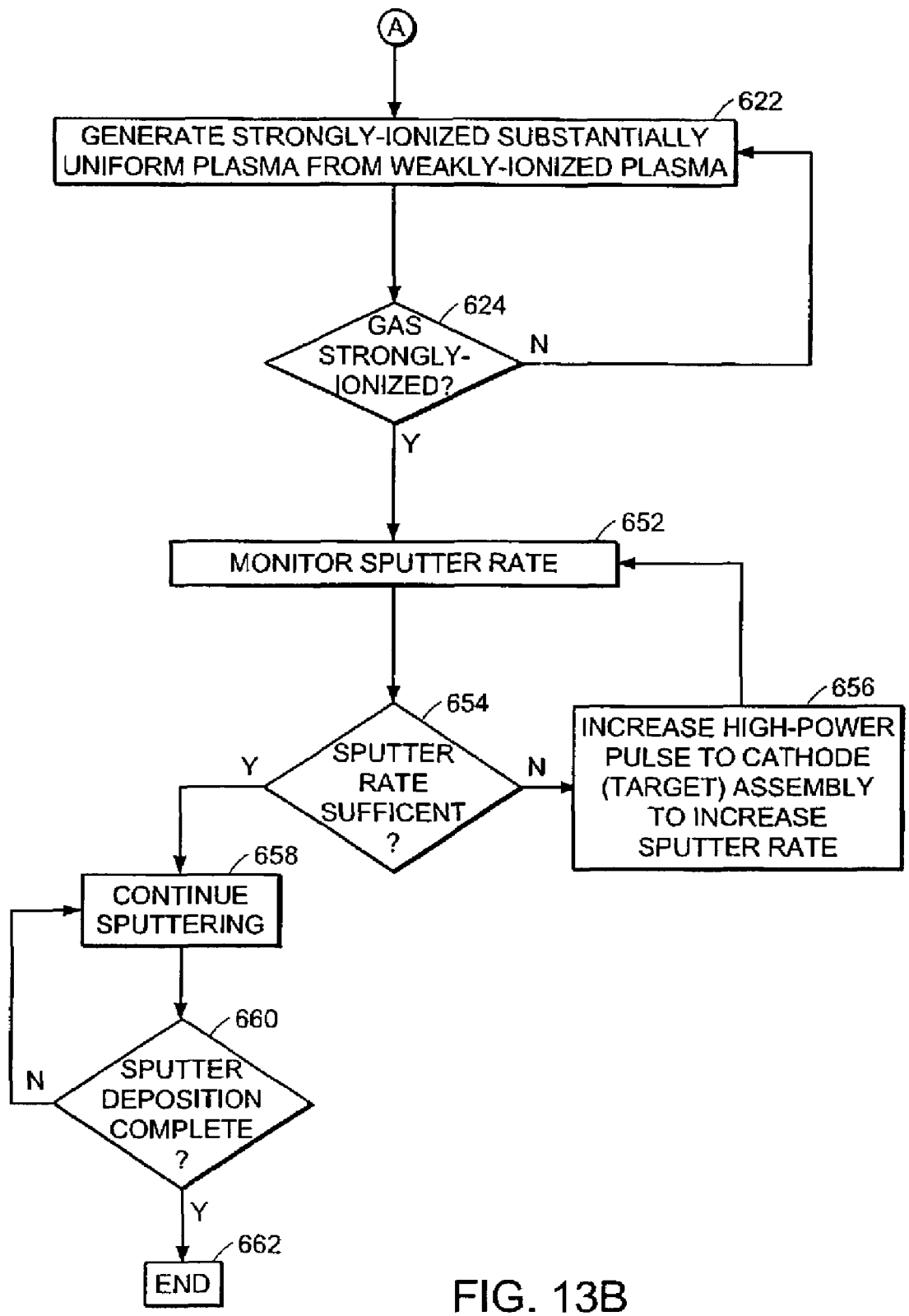

FIG. 13 includes FIGS. 13 A and 13 B which is a flowchart 650 of an illustrative process of controlling the sputter rate according to the present invention. The process is initiated (step 602) by activating various systems in the magnetron sputtering apparatus 200 of FIG. 2. For example, the chamber 202 is initially pumped down to a specific pressure (step 604). Next, the pressure in the chamber 202 is evaluated (step 606). In one embodiment, feed gas is then pumped into the chamber (step 608). The gas pressure is evaluated (step 610). If the gas pressure is correct, the pressure in the chamber 202 is again evaluated (step 612). If the pressure in the chamber 202 is correct, an appropriate magnetic field is generated proximate to the feed gas (step 614).

Assuming that the magnetic field is appropriate (step 616), the feed gas is ionized to generate a weakly-ionized plasma (step 618). In one embodiment, the weakly-ionized plasma can be generated by creating a relatively low current discharge between the cathode assembly 216 and the anode 238 of FIG. 2.

After the weakly-ionized plasma is generated (step 620), a strongly-ionized plasma is generated from the weakly-ionized plasma (step 622). In one embodiment, the strongly-ionized plasma is generated by applying a high-power pulse in the gap 244 between the cathode assembly 216 and the anode 238. In one embodiment, the strongly-ionized plasma is substantially homogeneous in the area 246 of FIG. 2. This homogeneity results in more uniform erosion of the sputtering target 220.

The cathode assembly 216 attracts ions from the strongly-ionized substantially uniform plasma because the the cathode assembly 216 is negatively biased relative to the anode 238. This causes the ions to bombard the cathode assembly 216 causing sputtering of the target material.

In one embodiment, the sputter rate is monitored (step 652) by known monitoring techniques. If the sputter rate is not sufficient (step 654), the power delivered to the plasma is increased (step 656). Increasing the magnitude of the high-power pulse applied in the gap 244 between the cathode assembly 216 and the anode 238 increases the power delivered to the plasma. The sputter rate is again evaluated (step 652). This process continues (step 658) until the sputter rate is sufficient (step 654). Once the sputter deposition is completed (step 660), the sputter process is ended (step 662).

EQUIVALENTS

While the invention has been particularly shown and described with reference to specific preferred embodiments, it should be understood by those skilled in the art that various changes in form and detail may be made therein without departing from the spirit and scope of the invention as defined herein.

What is claimed is:

1. A magnetically enhanced sputtering source comprising:
   a) an anode;
   b) a cathode assembly that is positioned adjacent to the anode, the cathode assembly including a sputtering target;
   c) an ionization source that generates a weakly-ionized plasma proximate to the anode and the cathode assembly;
   d) a magnet that is positioned to generate a magnetic field proximate to the weakly-ionized plasma, the magnetic field substantially trapping electrons in the weakly-ionized plasma proximate to the sputtering target; and
   e) a power supply generating a voltage pulse that produces an electric field between the cathode assembly and the anode, the power supply being configured to generate the voltage pulse with an amplitude and a rise time that increases an excitation rate of ground state atoms that are present in the weakly-ionized plasma to create a multi-step ionization process that generates a strongly-ionized plasma, which comprises ions that sputter target material, from the weakly-ionized plasma, the multi-step ionization process comprising exciting the ground state atoms to generate excited atoms, and then ionizing the excited atoms within the weakly-ionized plasma without forming an arc discharge.

2. The sputtering source of claim 1 wherein the power supply generates a constant power.

3. The sputtering source of claim 1 wherein the power supply generates a constant voltage.

4. The sputtering source of claim 1 wherein the electric field comprises a quasi-static electric field.

5. The sputtering source of claim 1 wherein the electric field comprises a pulsed electric field.

6. The sputtering source of claim 1 wherein the rise time of the voltage pulse is chosen to increase the ionization rate of the excited atoms in the weakly-ionized plasma.

7. The sputtering source of claim 1 wherein the weakly-ionized plasma reduces the probability of developing an electrical breakdown condition between the anode and the cathode assembly.

8. The sputtering source of claim 1 wherein the ions in the strongly-ionized plasma impact the surface of the sputtering target in a manner that causes substantially uniform erosion of the sputtering target.

9. The sputtering source of claim 1 wherein the strongly-ionized plasma is substantially uniform proximate to the sputtering target.

10. The sputtering source of claim 1 further comprising a substrate support that is positioned in a path of the sputtering flux.

11. The sputtering source of claim 10 further comprising a temperature controller that controls the temperature of the substrate support.

12. The sputtering source of claim 10 further comprising a bias voltage power supply that applies a bias voltage to a substrate that is positioned on the substrate support.

13. The sputtering source of claim 1 wherein a volume between the anode and the cathode assembly is chosen to increase the ionization rate of the excited atoms in the weakly-ionized plasma.

14. The sputtering source of claim 1 wherein the ionization source comprises an electrode.

15. The sputtering source of claim 1 wherein the ionization source comprises a DC power supply that generates an electric field proximate to the anode and the cathode assembly.

16. The sputtering source of claim 1 wherein the ionization source comprises an AC power supply that generates an electric field proximate to the anode and the cathode assembly.

17. The sputtering source of claim 1 wherein the ionization source is chosen from the group comprising a UV source, an X-ray source, an electron beam source, and an ion beam source.

18. The sputtering source of claim 1 wherein the magnet comprises an electro-magnet.

19. The sputtering source of claim 1 wherein the sputtering target is formed of a material chosen from the group comprising a metallic material, a polymer material, a super-conductive material, a magnetic material, a non-magnetic material, a conductive material, a non-conductive material, a composite material, a reactive material, and a refractory material.

20. A method of generating sputtering flux, the method comprising:
   a) ionizing a feed gas to generate a weakly-ionized plasma proximate to a sputtering target;
   b) generating a magnetic field proximate to the weakly-ionized plasma, the magnetic field substantially trapping electrons in the weakly-ionized plasma proximate to the sputtering target; and
   c) applying a voltage pulse to the weakly-ionized plasma, an amplitude and a rise time of the voltage pulse being chosen to increase an excitation rate of ground state atoms that are present in the weakly-ionized plasma to create a multi-step ionization process that generates a strongly-ionized plasma, which comprises ions that sputter target material, from the weakly-ionized plasma, the multi-step ionization process comprising exciting the ground state atoms to generate excited atoms, and then ionizing the excited atoms within the weakly-ionized plasma without forming an arc discharge.

21. The method of claim 20 wherein the applying the electric field comprises a applying a quasi-static electric field.

22. The method of claim 20 wherein the applying the electric field comprises applying a substantially uniform electric field.

23. The method of claim 20 wherein the applying the electric field comprises applying an electrical pulse across the weakly-ionized plasma.

24. The method of claim 23 further comprising selecting at least one of a pulse amplitude and a pulse width of the electrical pulse that increases an ionization rate of the strongly-ionized plasma.

25. The method of claim 23 further comprising selecting at least one of a pulse amplitude and a pulse width of the electrical pulse that reduces a probability of developing an electrical breakdown condition proximate to the sputtering target.

26. The method of claim 23 further comprising selecting at least one of a pulse amplitude and a pulse width of the electrical pulse that causes the strongly-ionized plasma to be substantially uniform in an area adjacent to a surface of the sputtering target.

27. The method of claim 23 wherein the electrical pulse comprises a pulse having a current density that is greater than 1 A/cm$^2$.

28. The method of claim 23 wherein the electrical pulse comprises a pulse having a pulse width that is greater than 1.0 microseconds.

29. The method of claim 23 wherein the electrical pulse comprises a pulse train having a repetition rate that is substantially between 0.1 Hz and 1 kHz.

30. The method of claim 20 wherein the ions in the strongly-ionized plasma impact the surface of the sputtering target in a substantially uniform manner.

31. The method of claim 20 wherein the strongly-ionized plasma is substantially uniform proximate to the sputtering target.

32. The method of claim 20 wherein the peak plasma density of the weakly-ionized plasma is less than about $10^{12}$ cm$^{-3}$.

33. The method of claim 20 wherein the peak plasma density of the strongly-ionized plasma is greater than about $10^{12}$ cm$^{-3}$.

34. The method of claim 20 further comprising forming a film on a surface of a substrate from the material sputtered from the sputtering target.

35. The method of claim 34 further comprising controlling a temperature of the film.

36. The method of claim 34 further comprising applying a bias voltage to the film.

37. The method of claim 20 wherein the ionizing the feed gas comprises exposing the feed gas to an electric field.

38. The method of claim 20 wherein the ionizing the feed gas comprises exposing the feed gas to an electrode that is adapted to emit electrons.

39. The method of claim 20 wherein the ionizing the feed gas comprises exposing the feed gas to at least one of a UV source, an X-ray source, an electron beam source, and an ion beam source.

40. A magnetically enhanced sputtering source comprising:
   a) means for ionizing a feed gas to generate a weakly-ionized plasma proximate to a sputtering target;
   b) means for generating a magnetic field proximate to the weakly-ionized plasma, the magnetic field substantially trapping electrons in the weakly-ionized plasma proximate to the sputtering target; and
   c) means for applying a voltage pulse to the weakly-ionized plasma, an amplitude and a rise time of the voltage pulse being chosen to increase an excitation rate of ground state atoms that are present in the weakly-ionized plasma to create a multi-step ionization process that generates a strongly-ionized plasma from the weakly-ionized plasma, the multi-step ionization process comprising exciting the ground state atoms to generate excited atoms, and then ionizing the excited atoms within the weakly-ionized plasma, without forming an arc discharge, to ions that sputter target material from the sputtering target.

41. The sputtering source of claim 1 wherein the cathode assembly and the anode are positioned so as to form a gap therebetween.

42. The sputtering source of claim 1 wherein the weakly-ionized plasma is generated from a feed gas that comprises the ground state atoms.

43. The sputtering source of claim 1 wherein the excited atoms within the weakly-ionized plasma are ionized by electrons to create the ions that sputter material from the sputtering target.

44. The sputtering source of claim 1 wherein the rise time of the voltage pulse is approximately between 0.01 and 100V/μsec.

45. The sputtering source of claim 1 wherein the amplitude of the voltage pulse is approximately between 100V and 30 kV.

46. The method of claim 20 wherein the weakly-ionized plasma is generated from a feed gas that comprises the ground state atoms.

47. The method of claim 20 wherein a duration of the weakly-ionized plasma is approximately between one microsecond and one hundred seconds.

48. The method of claim 20 wherein the ionizing the excited atoms within the weakly-ionized plasma to create ions that sputter material from the sputtering target comprises ionizing the excited atoms with electrons.

49. The method of claim 20 wherein the rise time of the voltage pulse is approximately between 0.01 and 100Vμsec.

50. The method of claim 20 wherein the amplitude of the voltage pulse is approximately between 100V and 30 kV.

* * * * *